US009601670B2

(12) United States Patent
Bhat et al.

(10) Patent No.: US 9,601,670 B2
(45) Date of Patent: Mar. 21, 2017

(54) METHOD TO FORM PRIMARY OPTIC WITH VARIABLE SHAPES AND/OR GEOMETRIES WITHOUT A SUBSTRATE

(71) Applicants: Chandan Bhat, Goleta, CA (US); Theodore Lowes, Lompoc, CA (US); Eric Tarsa, Goleta, CA (US)

(72) Inventors: Chandan Bhat, Goleta, CA (US); Theodore Lowes, Lompoc, CA (US); Eric Tarsa, Goleta, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/329,807

(22) Filed: Jul. 11, 2014

(65) Prior Publication Data
US 2016/0013373 A1     Jan. 14, 2016

(51) Int. Cl.
*H01L 33/62* (2010.01)
*H01L 33/54* (2010.01)
*H01L 33/38* (2010.01)
*H01L 33/60* (2010.01)
*H01L 33/48* (2010.01)

(52) U.S. Cl.
CPC ............ *H01L 33/54* (2013.01); *H01L 33/387* (2013.01); *H01L 33/60* (2013.01); *H01L 33/62* (2013.01); *H01L 33/486* (2013.01); *H01L 2924/10155* (2013.01); *H01L 2933/005* (2013.01)

(58) Field of Classification Search
CPC .............................................. H01L 2933/0058
See application file for complete search history.

(56) References Cited

U.S. PATENT DOCUMENTS

| | | | |
|---|---|---|---|
| 3,760,237 A | 9/1973 | Jaffe | 257/98 |
| 4,322,735 A | 3/1982 | Sadamasa et al. | |
| 4,511,425 A | 4/1985 | Boyd | 156/493 |
| 5,042,048 A | 8/1991 | Meyer | 372/108 |
| 5,122,943 A | 6/1992 | Pugh | 362/256 |
| 5,130,761 A | 7/1992 | Tanaka | 357/17 |
| 5,790,298 A | 8/1998 | Tonar | 359/267 |

(Continued)

FOREIGN PATENT DOCUMENTS

| | | |
|---|---|---|
| CN | 1274906 A | 11/2000 |
| CN | 1417868 A | 5/2003 |

(Continued)

OTHER PUBLICATIONS

Appeal Decision from Japanese Patent Appl. No. 2013-18375, dated Mar. 10. 2015.

(Continued)

*Primary Examiner* — Stephen W Smoot
(74) *Attorney, Agent, or Firm* — Koppel, Patrick, Heybl & Philpott

(57) ABSTRACT

A submount-free light emitter package with primary optic and method of fabricating the same are disclosed, these packages and methods comprising a light emitter with an optic. The optic may have a shape, which includes a portion that is wider at a point further from the light emitter than a point which is closer. The method includes a light emitter disposed on a carrier surface with at least one structure at least partially surrounding the light emitter. The encapsulant is over the light emitter forming a primary optic. The intermediate element at least partially defines the shape of the primary optic.

34 Claims, 7 Drawing Sheets

(56) References Cited

U.S. PATENT DOCUMENTS

| | | | | |
|---|---|---|---|---|
| 5,813,753 | A | 9/1998 | Vriens et al. | 362/293 |
| 5,942,770 | A | 8/1999 | Ishinaga et al. | 257/89 |
| 5,959,316 | A | 9/1999 | Lowery | 257/98 |
| 6,061,160 | A | 5/2000 | Maruyama | 359/152 |
| 6,183,100 | B1 | 2/2001 | Suckow et al. | 362/35 |
| 6,259,608 | B1 | 7/2001 | Berardinelli et al. | 361/777 |
| 6,296,367 | B1 | 10/2001 | Parsons et al. | 362/183 |
| 6,345,903 | B1 | 2/2002 | Koike | 257/E33.059 |
| 6,359,236 | B1 | 3/2002 | DiStefano et al. | 374/261 |
| 6,376,901 | B1 | 4/2002 | Abbott | |
| 6,376,902 | B1 | 4/2002 | Arndt | 257/678 |
| 6,392,294 | B1 | 5/2002 | Yamaguchi | |
| 6,447,124 | B1 | 9/2002 | Fletcher et al. | 359/604 |
| 6,454,437 | B1 | 9/2002 | Kelly | 362/246 |
| 6,536,913 | B1 | 3/2003 | Yajima et al. | 362/231 |
| 6,621,210 | B2 | 9/2003 | Kato et al. | 313/496 |
| 6,700,136 | B2 | 3/2004 | Guida | 257/79 |
| 6,707,069 | B2 | 3/2004 | Song et al. | 257/79 |
| 6,710,373 | B2 | 3/2004 | Wang | 257/79 |
| 6,717,353 | B1 | 4/2004 | Mueller et al. | 313/501 |
| 6,759,733 | B2 | 7/2004 | Arndt | 257/672 |
| 6,765,235 | B2 | 7/2004 | Taninaka et al. | 257/98 |
| 6,770,498 | B2 | 8/2004 | Hsu | 438/26 |
| 6,858,879 | B2 | 2/2005 | Waitl et al. | 257/99 |
| 6,964,877 | B2 | 11/2005 | Chen et al. | 438/20 |
| 6,995,510 | B2 | 2/2006 | Murakami | |
| D517,025 | S | 3/2006 | Asakawa | D13/180 |
| 7,009,285 | B2 | 3/2006 | Su et al. | 257/680 |
| 7,009,627 | B2 | 3/2006 | Abe et al. | 345/690 |
| 7,021,797 | B2 | 4/2006 | Minano et al. | 362/355 |
| 7,066,626 | B2 | 6/2006 | Omata | 362/257 |
| 7,119,422 | B2 | 10/2006 | Chin | 257/666 |
| 7,187,009 | B2 | 3/2007 | Fukasawa et al. | 257/98 |
| 7,224,000 | B2 | 5/2007 | Aanegola et al. | 257/98 |
| 7,244,965 | B2 | 7/2007 | Andrews et al. | 257/98 |
| 7,282,740 | B2 | 10/2007 | Chikugawa et al. | 257/79 |
| 7,282,785 | B2 | 10/2007 | Yoshida | 257/666 |
| 7,285,802 | B2 | 10/2007 | Ouderkirk et al. | 257/98 |
| 7,286,926 | B2 | 10/2007 | Gotoh et al. | |
| 7,303,315 | B2 | 12/2007 | Ouderkirk et al. | 362/294 |
| D572,210 | S | 7/2008 | Lee | D13/180 |
| D572,670 | S | 7/2008 | Ono et al. | D13/180 |
| D576,574 | S | 9/2008 | Kobayakawa | D13/180 |
| 7,429,757 | B2 | 9/2008 | Oyama et al. | 257/675 |
| 7,579,628 | B2 | 8/2009 | Inoguchi | 257/81 |
| 7,622,795 | B2 | 11/2009 | Chiang | 257/675 |
| 7,635,915 | B2 | 12/2009 | Xie et al. | 25/692 |
| 7,692,206 | B2 | 4/2010 | Loh | 257/99 |
| 7,777,412 | B2 | 8/2010 | Pang | 313/506 |
| 7,875,899 | B2 | 1/2011 | Yasuda | 257/99 |
| 7,923,831 | B2 | 4/2011 | Ng | 257/692 |
| 8,217,414 | B2 | 7/2012 | Hayashi | 257/99 |
| 2002/0061174 | A1 | 5/2002 | Hurt et al. | |
| 2002/0066905 | A1 | 6/2002 | Wang | |
| 2002/0171087 | A1 | 11/2002 | Krames et al. | |
| 2003/0116769 | A1 | 6/2003 | Song et al. | |
| 2003/0121511 | A1 | 7/2003 | Hashimura et al. | |
| 2003/0160256 | A1 | 8/2003 | Durocher et al. | 257/88 |
| 2003/0183852 | A1 | 10/2003 | Takenaka | |
| 2004/0016938 | A1 | 1/2004 | Baretz et al. | 257/100 |
| 2004/0037076 | A1 | 2/2004 | Katoh et al. | 362/235 |
| 2004/0041222 | A1 | 3/2004 | Loh | |
| 2004/0047151 | A1 | 3/2004 | Bogner et al. | |
| 2004/0079957 | A1 | 4/2004 | Andrews et al. | |
| 2004/0080939 | A1 | 4/2004 | Braddell et al. | |
| 2004/0090174 | A1 | 5/2004 | Tasch et al. | |
| 2004/0126913 | A1 | 7/2004 | Loh | |
| 2004/0201028 | A1 | 10/2004 | Waitl | |
| 2004/0207999 | A1 | 10/2004 | Suehiro et al. | 362/84 |
| 2004/0227149 | A1 | 11/2004 | Ibbetson | |
| 2004/0238930 | A1 | 12/2004 | Arndt | |
| 2005/0072981 | A1 | 4/2005 | Suenaga | 257/88 |
| 2005/0077535 | A1 | 4/2005 | Li | |
| 2005/0082574 | A1 | 4/2005 | Tasch et al. | |
| 2005/0110033 | A1 | 5/2005 | Heremans et al. | 257/98 |
| 2005/0117320 | A1 | 6/2005 | Leu et al. | |
| 2005/0152127 | A1 | 7/2005 | Kamiya et al. | |
| 2005/0156187 | A1 | 7/2005 | Isokawa | |
| 2005/0179376 | A1 | 8/2005 | Fung et al. | |
| 2005/0199899 | A1 | 9/2005 | Lin et al. | 257/99 |
| 2005/0231983 | A1 | 10/2005 | Dahm | 362/800 |
| 2005/0253130 | A1 | 11/2005 | Tsutsumi et al. | 257/13 |
| 2006/0049477 | A1 | 3/2006 | Arndt | |
| 2006/0054912 | A1 | 3/2006 | Murakami et al. | |
| 2006/0060867 | A1 | 3/2006 | Suehirom | 257/81 |
| 2006/0091406 | A1 | 5/2006 | Kaneko et al. | 257/81 |
| 2006/0102917 | A1 | 5/2006 | Oyama et al. | 257/99 |
| 2006/0105478 | A1 | 5/2006 | Camras et al. | |
| 2006/0105485 | A1 | 5/2006 | Basin | 438/27 |
| 2006/0108594 | A1 | 5/2006 | Iwasari et al. | |
| 2006/0131591 | A1 | 6/2006 | Sumitani | |
| 2006/0151809 | A1 | 7/2006 | Isokawa | |
| 2006/0180925 | A1 | 8/2006 | Lee | 257/717 |
| 2006/0220046 | A1 | 10/2006 | Yu et al. | |
| 2006/0267031 | A1 | 11/2006 | Tasch et al. | |
| 2006/0267042 | A1 | 11/2006 | Izuno et al. | 257/100 |
| 2006/0278882 | A1 | 12/2006 | Leung et al. | 257/98 |
| 2006/0284207 | A1 | 12/2006 | Park | 257/99 |
| 2006/0291185 | A1 | 12/2006 | Atsushi | 362/29 |
| 2007/0070530 | A1 | 3/2007 | Seo | |
| 2007/0096139 | A1 | 5/2007 | Schultz | |
| 2007/0145401 | A1 | 6/2007 | Ikehara | |
| 2007/0221928 | A1 | 9/2007 | Lee | 257/79 |
| 2007/0241357 | A1 | 10/2007 | Yan | 257/98 |
| 2007/0262328 | A1 | 11/2007 | Bando | |
| 2007/0269586 | A1 | 11/2007 | Leatherdale | |
| 2007/0294975 | A1 | 12/2007 | Nadar et al. | 52/483 |
| 2007/0295975 | A1 | 12/2007 | Omae | 257/89 |
| 2008/0026498 | A1 | 1/2008 | Tarsa et al. | 438/26 |
| 2008/0041625 | A1 | 2/2008 | Cheong | 174/521 |
| 2008/0074032 | A1 | 3/2008 | Yano et al. | 313/503 |
| 2008/0093606 | A1 | 4/2008 | Pan et al. | |
| 2008/0149960 | A1 | 6/2008 | Amo et al. | 257/98 |
| 2008/0170391 | A1 | 7/2008 | Norfidathul | 362/227 |
| 2008/0191610 | A1 | 8/2008 | Oshio | |
| 2008/0198594 | A1 | 8/2008 | Lee | |
| 2008/0230790 | A1 | 9/2008 | Seko et al. | |
| 2008/0258156 | A1 | 10/2008 | Hata | 257/88 |
| 2008/0296590 | A1 | 12/2008 | Ng | 257/88 |
| 2009/0057708 | A1 | 3/2009 | Abdul Karim et al. | 257/100 |
| 2009/0072251 | A1 | 3/2009 | Chan et al. | |
| 2009/0095966 | A1 | 4/2009 | Keller et al. | 257/98 |
| 2009/0129085 | A1 | 5/2009 | Aizar et al. | 362/247 |
| 2009/0283781 | A1 | 11/2009 | Chan et al. | |
| 2010/0044735 | A1 | 2/2010 | Oyamada | 257/98 |
| 2010/0103660 | A1 | 4/2010 | Van de Ven et al. | 362/231 |
| 2010/0193822 | A1 | 8/2010 | Inobe et al. | 257/98 |
| 2011/0049545 | A1 | 3/2011 | Basin et al. | 257/98 |
| 2011/0108874 | A1 | 5/2011 | Chu | 257/98 |
| 2011/0121345 | A1 | 5/2011 | Andrews et al. | |
| 2011/0186880 | A1 | 8/2011 | Kohler et al. | 257/91 |
| 2011/0193118 | A1 | 8/2011 | Oshima et al. | |
| 2011/0278617 | A1 | 11/2011 | Lee | |
| 2012/0235199 | A1 | 9/2012 | Andrews et al. | |
| 2012/0257386 | A1 | 10/2012 | Harbers et al. | 362/235 |
| 2012/0268957 | A1 | 10/2012 | Premysler | 362/455 |
| 2013/0056774 | A1 | 3/2013 | Hong et al. | 257/98 |
| 2013/0063024 | A1 | 3/2013 | Wada | 313/512 |
| 2013/0337591 | A1* | 12/2013 | Chen | H01L 33/58 438/27 |
| 2014/0034986 | A1 | 2/2014 | Bradley | 257/98 |
| 2015/0137162 | A1 | 5/2015 | Sabathil | 257/98 |

FOREIGN PATENT DOCUMENTS

| | | |
|---|---|---|
| CN | 2549313 | 5/2003 |
| CN | 2617039 Y | 5/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1874011 A | 12/2006 |
| CN | 1913135 A | 2/2007 |

(56) References Cited

FOREIGN PATENT DOCUMENTS

| | | |
|---|---|---|
| CN | 1977399 A | 6/2007 |
| CN | 101005109 A | 7/2007 |
| CN | 101013689 | 8/2007 |
| CN | 101360368 | 2/2009 |
| CN | 101611502 A | 12/2009 |
| DE | WO 9931737 | 6/1999 |
| DE | WO 2004027882 | 1/2004 |
| DE | 202007012162 | 4/2008 |
| EP | 0684648 | 11/1995 |
| EP | 1005085 A2 | 5/2000 |
| EP | 1005085 A3 | 12/2000 |
| EP | 1187226 | 3/2002 |
| EP | 1187227 | 3/2002 |
| EP | 1187228 | 3/2002 |
| EP | 1418630 A1 | 5/2004 |
| EP | 1521313 | 4/2005 |
| EP | 1538680 A2 | 6/2005 |
| EP | 1653254 A2 | 5/2006 |
| EP | 1693904 | 8/2006 |
| EP | 1864780 | 12/2007 |
| EP | 1953834 A1 | 8/2008 |
| GB | 2420221 A | 12/2004 |
| GB | 2458972 A | 10/2009 |
| GB | 2466633 | 7/2010 |
| GB | 2466633 A | 7/2010 |
| JP | 53118019 | 10/1978 |
| JP | S53118019 | 10/1978 |
| JP | S53126570 | 10/1978 |
| JP | 5927559 A | 2/1984 |
| JP | 59027559 | 2/1984 |
| JP | 6148951 | 3/1986 |
| JP | 6148951 A | 3/1986 |
| JP | 61048951 | 3/1986 |
| JP | S62160564 | 3/1986 |
| JP | 62047156 | 2/1987 |
| JP | 62140758 | 9/1987 |
| JP | 038459 | 1/1991 |
| JP | 07202271 | 8/1995 |
| JP | 7202271 A | 8/1995 |
| JP | 07231120 | 8/1995 |
| JP | 08032120 | 2/1996 |
| JP | 8139257 | 5/1996 |
| JP | 10135492 | 5/1998 |
| JP | 10321909 | 12/1998 |
| JP | 11008405 | 1/1999 |
| JP | 11054802 | 2/1999 |
| JP | 11150306 | 6/1999 |
| JP | 11261113 | 9/1999 |
| JP | 2000188358 | 7/2000 |
| JP | 2000223751 | 8/2000 |
| JP | 2000261041 | 9/2000 |
| JP | 2001044506 | 2/2001 |
| JP | 2001168400 | 6/2001 |
| JP | 2001237463 | 8/2001 |
| JP | 2001518692 | 10/2001 |
| JP | 2002009217 | 1/2002 |
| JP | 2002223005 | 8/2002 |
| JP | 2002280479 A | 9/2002 |
| JP | 2002374005 | 12/2002 |
| JP | 2003007946 A | 1/2003 |
| JP | 2003197974 | 7/2003 |
| JP | 2003218405 | 7/2003 |
| JP | 2003264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004111937 A | 4/2004 |
| JP | 2004146815 | 5/2004 |
| JP | 2004200236 | 7/2004 |
| JP | 2004228387 | 8/2004 |
| JP | 2004327955 | 11/2004 |
| JP | 2004335740 | 11/2004 |
| JP | 2004335880 | 11/2004 |
| JP | 2004342870 | 12/2004 |
| JP | 200519838 A | 1/2005 |
| JP | 2005019838 | 1/2005 |
| JP | 2005045199 | 2/2005 |
| JP | 2005079167 | 3/2005 |
| JP | 2005150624 | 6/2005 |
| JP | 2005223222 | 8/2005 |
| JP | 2005259754 | 9/2005 |
| JP | 2005259972 | 9/2005 |
| JP | 2005310935 | 11/2005 |
| JP | 2005539386 | 12/2005 |
| JP | 2006508537 | 3/2006 |
| JP | 2006509372 A | 3/2006 |
| JP | 2006108517 | 4/2006 |
| JP | 2006119357 | 5/2006 |
| JP | 2006179520 | 7/2006 |
| JP | 2006253689 | 9/2006 |
| JP | 2006324589 | 11/2006 |
| JP | 2006525679 | 11/2006 |
| JP | 2006332234 | 12/2006 |
| JP | 2006344692 | 12/2006 |
| JP | 200795797 A | 4/2007 |
| JP | 2007094088 | 4/2007 |
| JP | 2007109836 | 4/2007 |
| JP | 2007509505 | 4/2007 |
| JP | 2007165029 | 6/2007 |
| JP | 2007165840 | 6/2007 |
| JP | 2007184542 | 7/2007 |
| JP | 2007243226 | 9/2007 |
| JP | 2007273763 | 10/2007 |
| JP | 2007281323 | 10/2007 |
| JP | 2007317896 | 12/2007 |
| JP | 2007329516 | 12/2007 |
| JP | 2008518461 | 5/2008 |
| JP | 2008521236 | 6/2008 |
| JP | WO 2008082098 | 7/2008 |
| JP | 2000223752 | 8/2008 |
| JP | H11054802 | 3/2011 |
| RU | 2251761 | 2/2005 |
| TW | 200616246 A | 5/2006 |
| WO | WO 0217405 | 2/2002 |
| WO | WO 03049204 | 6/2003 |
| WO | WO 2004003660 | 4/2004 |
| WO | WO 2004036660 | 4/2004 |
| WO | WO 2004036660 A1 | 4/2004 |
| WO | WO 2004044877 | 5/2004 |
| WO | WO 2004053933 A2 | 6/2004 |
| WO | WO 2005043627 A1 | 5/2005 |
| WO | WO 2005104247 | 11/2005 |
| WO | WO 2006016398 | 2/2006 |
| WO | WO 2006046981 | 5/2006 |
| WO | WO 2006054228 | 5/2006 |
| WO | WO 2006054228 A2 | 5/2006 |
| WO | WO 2006054228 A3 | 5/2006 |
| WO | WO 2006054228 | 6/2006 |
| WO | WO 2006135502 | 12/2006 |
| WO | WO 2007121486 A2 | 10/2007 |
| WO | WO 2007122516 | 11/2007 |
| WO | WO 2007127029 A2 | 11/2007 |
| WO | WO 2008081794 A1 | 7/2008 |
| WO | WO 2008082098 | 7/2008 |
| WO | WO 2010005294 | 1/2010 |
| WO | WO 2012099145 A1 | 7/2012 |

OTHER PUBLICATIONS

Office Action from Japanese Patent Appl. No. 2013-18883, dated Feb. 24, 2015.
Noting of loss of rights from European Patent Appl. No. 08253519.6-1558/2056363, dated Apr. 16, 2015.
Notice of Reasons for Rejection from Japanese Patent Appl. No. 2011-259253, dated Feb. 3, 2015.
Office Action from U.S. Appl. No. 12/875,873, dated Mar. 2, 2015.
Response from U.S. Appl. No. 12/875,873, filed Apr. 22, 2015.
Office Action from U.S. Appl. No 13/652,241, dated Mar. 17, 2015.
Office Action from U.S. Appl. No. 13/804,309, dated Mar. 10, 2015.

(56) References Cited

OTHER PUBLICATIONS

Examination Report from EU Application No. 07 789 665.2, dated Jan. 21, 2015.
Third Office Action from Chinese Appl. No. 201080027586.0, dated Jan. 21, 2015.
Office Action from Taiwanese Appl. No. 099113616, dated Dec. 26, 2014.
Office Action from U.S. Appl. No. 12/069,827, dated Feb. 6, 2015.
Office Action from U.S. Appl. No. 12/002,410, dated Feb. 23, 2015.
Notification of Reexamination from Chinese Appl. No. 2010101673462, dated Jan. 12, 2015.
Third Office Action from Chinese Appl. No. 2008800092557, dated Dec. 29, 2014.
Third Office Action from Chinese Patent Appl. No. 2012100462482, dated Oct. 10, 2014.
Pretrial Report from Japanese Appl. No. 2011-259253. dated Sep. 30, 2014.
Decision of Rejection from Japanese Appl. No. 2012-288000, dated Oct. 28, 2014.
Fourth Office Action from Chinese Appl. No. 2011100391389, dated Nov. 24, 2014.
Decision of Patent Grant from Japanese Appl. No. 2011-534993, dated Dec. 24, 2014.
Office Action from U.S. Appl. No. 12/875,873, dated Oct. 3, 2014.
Office Action from U.S. Appl. No. 11/982,275, dated Oct. 15, 2014.
Office Action from U.S. Appl. No. 12/069,827, dated Oct. 28, 2014.
Office Action from U.S. Appl. No. 12/002,410, dated Nov. 4, 2014.
Office Action from U.S. Appl. No. 13/652,241, dated Nov. 19, 2014.
Reasons for Rejection from Japanese Patent Appl. No 2011-534993, dated Oct. 7, 2014.
Second Office Action from Chinese Patent Appl. No 201080027586.0, dated Sep. 16, 2014.
Notification of Reexamination from Chinese Appl. No 2010800016584, dated Sep. 11, 2014.
Decision to Grant from Russian Patent Appl No. 2011146934/28. dated Aug. 14, 2014.
Extended European Search Report from European Patent Appl. No. 08253519.6, dated Aug. 13, 2014.
Office Action from U.S. Appl. No. 12/875,873, dated Jun. 25, 2014.
Response to OA from U.S. Appl. No. 12/875,873, filed Aug. 12, 2014.
Office Action from U.S. Appl. No 12/069,827, dated Jul. 11, 2014.
Office Action from U.S. Appl. No 12/695,978, dated Jul. 16, 2014.
Response to OA from U.S. Appl. No. 12/695,978, filed Aug. 11, 2014.
Reason for Rejection from Japanese Patent Appl. No 2009-507195, dated Jul. 15, 2014.
Notification of Allowance from Taiwan Appl. Patent No. 103202911, dated Jul. 16, 2014.
Office Action from Japanese Patent Appl. No 2008-81533, dated Jul. 22, 2014.
Third Office Action and Search Report from Chinese Patent Appl. No 2011100391389, dated Jun. 23, 2014.
Search Report from Chinese Patent Appl. No. 201210046248.2, dated Apr. 15, 2014.
International Preliminary Report on Patentability from PCT/US2012/065060, dated Jun. 12, 2014.
Notification of Reexamination from Chinese Patent Appl. No. 2008800092557, dated May 12, 2014.
Examination from European Patent Appl. No. 09 824 413.0-1551, dated May 16, 2014.
Decision on Rejection from Chinese Patent Appl. No. 2007101521097, dated Mar. 17, 2014.
Office Action from U.S. Appl. No. 11/982,275, dated Apr. 30, 2014.
Office Action from U.S. Appl. No. 12/002,410, dated May 20, 2014.
Office Action from U.S. Appl. No. 12/875,873, dated Feb. 25, 2014.
Office Action from U.S. Appl. No. 13/652,241, dated Mar. 12, 2014.
Office Action from U.S. Appl. No. 12/069,827, dated Apr. 1, 2014.
Decision of Rejection from Japanese Patent Appl. No. 2011-259253, dated Mar. 25, 2014.

Office Action from Russian Patent Appl. No. 2011146934/28, dated Feb. 28, 2014.
Second Office Action from Chinese Patent Appl. No. 201210046248.2, dated Apr. 15, 2014.
Partial European Search Report from European Patent Appl. No. 08253519.6-1564, dated Apr. 29, 2014.
First Office Action from Chinese Patent Appl. No. 201080027586.0, dated Feb. 8, 2014.
Interrogation from Japanese Patent Appl. No. 2009-507195, dated Jan. 28, 2014.
Interrogation from Japanese Patent Appl. No. 2008-281533, dated Jan. 21, 2014.
International Search Report and Written Opinion from PCT/US2013/073921, dated Feb. 18, 2014.
Decision of Registration from Japanese Design Appl. No. 2012-030304, dated Jan. 21, 2014.
Office Action from U.S. Appl. No. 12/757,891, dated Jan. 14, 2014.
Office Action from U.S. Appl. No. 12/695,978, dated Jan. 31, 2014.
Office Action from U.S. Appl. No. 12/002,410, dated Feb. 4, 2014.
Fifth Office Action from Chinese Patent Appl. No. 2007/10152109.7, dated Jan. 6, 2014.
Supplemental European Search Report from European Patent Appl. No. 10731037.7, dated Jan. 9, 2014.
Search Report for European Patent Appl. No. 10731037.7, dated Dec. 11, 2013.
Notice of Reasons for Rejection from Japanese Patent Appl. No. 2011-534993, dated Nov. 12, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 11/496,922, dated Oct. 9, 2013.
Office Action from U.S. Appl. No. 12/875,873, dated Oct. 18, 2013.
Office Action from U.S. Appl. No. 12/695,978, dated Sep. 17, 2013.
Office Action from U.S. Appl. No. 13/652,241, dated Sep. 11, 2013.
Office Action from U.S. Appl. No. 12/002,410, dated Sep. 10, 2013.
Office Action from Japanese Patent Appl. No. 2012-288000, dated Oct. 8, 2013.
Decision of Rejection from Chinese Patent Appl. No. 201110039138.9 dated Sep. 25, 2013.
Appeal Decision from Japanese Patent Appl. No. 2008-515699, dated Sep. 20, 2013.
Decision of Rejection from Chinese Patent Appl. No. 201001067346.2, dated Aug. 30, 2013.
Fourth Office Action from Chinese Patent Appl. No. 200710152109.7, dated Jun. 28, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/291,293, dated Aug. 20, 2013.
Notice of Reasons for Rejection from Japanese Patent Application No. 2007-211901, dated Apr. 9, 2013.
Decision of Rejection from Japanese Patent Application No. 2011-545616, dated Apr. 26, 2013.
Third Office Action from Chinese Patent Application No. 200710152109.7, dated: Mar. 5, 2013.
Interrogation from Japanese Patent Application No. 2008-515699, dated Feb. 19, 2013.
Communication from European Patent Appl. No. 09824413.0-1551, dated Feb. 28, 2013.
European Search Report from European Patent Appl. No. 09824413.0-1551, dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17, 2013.
Extended Search Report for European Patent Application No. 09824413.0-1551, dated Feb. 11, 2013.
Second Office Action from Chinese Patent Appl. No. 201110039138.9, dated Jan. 31, 2013.
International Search Report and Written Opinion from PCT application No. PCT/US2012/065060, dated Feb. 20, 2013.

(56) References Cited

OTHER PUBLICATIONS

First Office Action from Chinese Patent Application No. 201080001658.4, dated Sep. 24, 2012.
Interrogation from Japanese Patent Application No. 2007-211901, dated Aug. 21, 2012.
Examination Report from European Patent Application No. 07789665.2, dated Aug. 20, 2012.
Decision of Rejection from Chinese Patent Application No. 200880009255.7, dated Sep. 5, 2012.
First Office Action for Chinese Patent Application No. 201110039138.9, dated Jun. 4, 2012.
Decision of Rejection from Japanese Patent Application No. 2008-515699, dated Jul. 17, 2012.
Notice of Reasons for Rejection from Japanese Patent Application No. 2009-507195, dated May 8, 2012.
First Office Action for Chinese Patent Application No. 200980153995.2 , dated May 4, 2012.
First Office Action for Chinese Patent Application No. 200910145412.3, dated Apr. 28, 2012.
Office Action from patent U.S. Appl. No 11/465,120, dated: Jun. 19, 2012.
Office Action from patent U.S. Appl. No. 11/982,275, dated: Jul. 9, 2012.
Office Action from patent U.S. Appl. No. 12/757,179, dated: Jul. 16, 2012.
Notification of the First Office Action from Chinese Patent Application No. 201010167346.2, dated Feb. 29, 2012.
Decision of Rejection for Japanese Patent Application No. 2007-211901, dated: Jan. 30, 2012.
US Published Application No. 2004/0079957 by Andrews, et al., dated: Apr. 29, 2004.
First Office Action for Chinese Patent Application No. CN 200710152109.7 issued Jul. 29, 2011.
International Search Report and Written Opinion for PCT Appl. No. PCT/US2011/001457 mailed Dec. 13, 2011.
Notice of Reasons for Rejection for Japanese Patent Appl. No JP 2008-281533 dated Jun. 24, 2011.
Notice of Reasons for Rejection for Japanese Patent Appl. No JP 2009-507195 dated Jun. 10, 2011.
Notice of Reasons for Rejection for Japanese Patent Appl No. JP 2007-211901 dated Apr. 14, 2011.
Notice of Reasons for Rejection for Japanese Patent Appl. No. JP 2008-515699 dated May 19, 2011.
International Preliminary Report on Patentability for PCT/CN2010/070073 mailed Apr. 28, 2011.
International Search Report and Written Opinion for counterpart PCT Application No PCT/CN2010/001865 mailed Jun. 9, 2011.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Second Office Action for Chinese Patent Appl. No. CN 200880009255.7 mailed Oct. 13, 2011.
Extended Supplementary European Search Report for EP Application No. EP07789665.2 dated Nov. 7, 2011.
Office Action from U.S. Appl. No 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/321,059, dated: Oct. 4, 2011.
Office Action from U.S. Appl. No 12/069,827, dated: Oct. 26, 2011.
U.S. Appl. No. 11/380,402, filed Apr. 26, 2006, Jian Hui Xie.
Nichia Corp. White LED Part No. NSPW300BS, Specification Fop Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-009-002857, dated: Jul. 24, 2009.
Related PCT International Search Report and Written Opinion, PCT/IB2007/002432, Date: Jan. 11, 2008.
International Search Report and Written Opinion for Appl. No. PCT/CN2010/070073 mailed Apr. 15, 2010.
U.S. Appl. No. 14/053,404, filed Oct. 14, 2013, Heikman, et al.
Office Action in related U.S. Appl. No. 11/496,922, dated: Jun. 10, 2010.
Office Action in related U.S. Appl. No 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No 12/152,766, dated: Mar. 12, 2010.
Office Action in related U.S. Appl. No 11/465,120, dated: Sep. 8, 2010.
Office Action in related U.S. Appl. No 11/465,120, dated: Dec. 13, 2010.
Office Action in related U.S. Appl. No. 11/465,120, dated: Mar. 9, 2010.
Office Action in related U.S. Appl. No, 12/635,818, dated: Oct. 14, 2010.
Office Action in related U.S. Appl. No 12/695,978, dated: Dec. 20, 2010.
Office Action in related U.S. Appl. No 12/695,978, dated: May 10, 2011.
Office Action in related U.S. Appl. No. 12/069,827, dated: Oct. 29, 2010.
Office Action in related U.S. Appl. No 12/069,827, dated: Apr. 20, 2010.
Office Action in related U.S. Appl. No. 12/069,827, dated: Jan. 27, 2011.
Japanese Patent Application 2001-60072, dated: Mar. 6, 2001.
Related Office Action from U.S. Appl. No. 11/277,717, dated: Jan. 6, 2009.

(56) References Cited

OTHER PUBLICATIONS

Related Office Action from related U.S. Appl. No. 11/277,717, dated Jul. 27, 2009.
Office Action in related U.S. Appl. No 12/154,691, dated Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
CREE® XLAMP® MC-E LEDS Product Info Sheets, pp. 1-3.
Nichia Corporation LEDS, Models NSSM016G, NSSM227, NESM026X, NSSM026BB, NESM005A, 9 Pages.
Office Action from U.S. Appl. No. 12/868,567, dated Jul. 5, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 12/757,891, dated Jun. 18, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No. 12/868,567, filed Jan. 14, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to OA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868,567, dated Feb. 22, 2013.
Response to OA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/695,978, dated Apr. 18, 2013.
Response to OA from U.S. Appl. No. 12/695,978, filed Jul. 10, 2013.
Office Action from U.S. Appl. No. 11/465,120, mailed Dec. 9, 2011.
US Publication No. 2004/0256706, dated: Dec. 2004 to Nakashima, Shintaro.
Office Action from U.S. Appl. No. 12/002,410, mailed Mar. 28, 2012.
Office Action from U.S. Appl. No. 12/002,410, mailed Dec. 21, 2011.
US Publication No. 2008/0296590. dated: Dec. 2008, to Ng, Kee Yean.
Response to Office Action for U.S. Appl. No. 12/002,410, filed Mar. 8, 2012.
Office Action from U.S. Appl. No. 12/757,179, mailed Jan. 19, 2012.
US Publication No. 2011/0049545, dated: Mar. 2011 to Basin et al.
Office Action from U.S. Appl. No. 11/496,922. mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,275, mailed Mar. 23, 2012.
US Publication No. 2002/0030194 A1, dated: Mar. 2002, to Camras et al.
US Publication No. 2005/0179041 A1, dated: Aug. 2005, to Barbers et al.
Office Action from U.S. Appl. No. 12/614,989, mailed Mar. 12, 2012.
Office Action from U.S. Appl. No. 12/069,827, mailed Apr. 3, 2012.
Office Action from U.S. Appl. No. 11/465,120, dated: Jun. 19, 2012.
Office Action from U.S. Appl. No. 11/982,275, dated: Jul. 9, 2012.
Office Action from U.S. Appl. No. 12/757,179, dated: Jul. 16, 2012.
Patent Certificate from Chinese Patent Appl. No ZL2008800092557. dated Jul. 15, 2015.
Notice of Allowance from Taiwanese Patent Appl. No. 099113616, dated Sep. 2, 2015.
Office Action from U.S. Appl. No. 13/652,241, dated Sep. 11, 2015.
Office Action from U.S. Appl. No. 14/478,571, dated Oct. 1, 2015.
Reexamination Decision from Chinese Patent Appl. No. 200710152109.7, dated Nov. 26, 2015.
Second Office Action from Chinese Patent Appl. No. 2010106242824, dated Dec. 29, 2015.
Notice of Allowance from Taiwanese Patent Appl. No. 100131665, dated Dec. 15, 2015.
Office Action from U.S. Appl. No. 12/059,827, Nov. 12, 2015.
Office Action from U.S. Appl. No. 12/002,410, Nov. 30, 2015.
First Office Action from Chinese Patent Appl. No. 2011800511887, dated Apr. 30, 2015.
Examination Report from Taiwanese appl. No. 100130234. dated Jun. 24, 2015.
Examination Report from Taiwanese Patent Appl. No. 100131665. dated Jul. 8, 2015.
International Preliminary Report on Patentability from appl. No. PCT/US2013/073921, dated Jun. 25, 2015.
Notice of Re-examination from Chinese Patent Appl. No. 200710152109.7, dated Jun. 9, 2015.
Pretrial Report from Japanese Appl. No. 2012-288000, dated May 19, 2015.

(56) References Cited

OTHER PUBLICATIONS

Fourth Office Action from Chinese Patent Appl. No. 201080027586.0, dated Jul. 29, 2015.
Office Action from U.S. Appl. No. 12/002,410, dated Jun. 17, 2015.
Response to OA from U.S. Appl. No. 12/002,410, filed Aug. 14, 2015.
Office Action from U.S. Appl. No. 12/069,827, dated Jun. 19, 2015.
Response to OA from U.S. Appl. No. 12/069,827, filed Aug. 19, 2015.
Office Action from U.S. Appl. No. 12/875,873, dated Jun. 29, 2015.
Notice of Completion of Formalities for Patent Register from Chinese Patent Appl. No. 2011100391389, dated Mar. 9, 2015.
Office Action from European Patent Appl. No. 07840092.6-1551, May 4, 2015.
First Office Action from Chinese Appl. No. 2010106242824, dated Feb. 17, 2015.
Office Action for Chinese Application No. 2012800586074; Mar. 17, 2016.
Office Action for Chinese Application No. 2010106242824; Apr. 15, 2016.
Office Action for Chinese Application No. 2010101673462; Apr. 26, 2016.
Office Action for U.S. Appl. No. 12/002;410; Jun. 14, 2016.
Office Action for U.S. Appl. No. 14/705,228; Jun. 17, 2016.
Office Action for U.S. Appl. No. 13/652,241; Jul. 1, 2016.
Notice of Allowance from Chinese Patent Appl. No. 201180051188.7, dated Feb. 3, 2016.
Decision of Rejection from Taiwanese Patent Appl. No. 100130234, dated Feb. 22, 2016.
Office Action from U.S. Appl. No. 12/875,873; Jan. 29, 2016.
Office Action from U.S. Appl. No. 12/069,827; Mar. 1, 2016.
Office Action from U.S. Appl. No. 13/652,241; Mar. 10, 2016.
Office Action from U.S. Appl. No. 14/478,571; Apr. 1, 2016.
Examination Report from European Application No. 7789665.2; Dated Jul. 13, 2016.
Office Action for U.S. Appl. No. 12/069,827; Dated Jul. 14, 2016.
Office Action for U.S. Appl. No. 12/875,873; Dated Aug. 12, 2016.
Foreign Office Action for Chinese Application 2010106242824; Dated Sep. 5, 2016.
Office Action for U.S. Appl. No. 13/652,241; Dated Sep. 29, 2016.
Foreign Office Action for Chinese Application No. 2012800586074; Dated Nov. 21, 2016.
Office Action for U.S. Appl. No. 14/705,228; Dated Nov. 25, 2016.

* cited by examiner

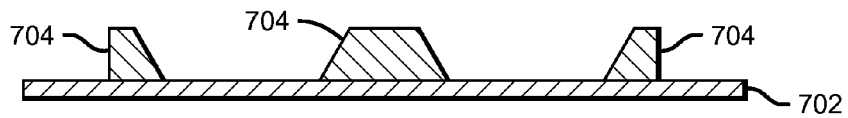
FIG. 7A
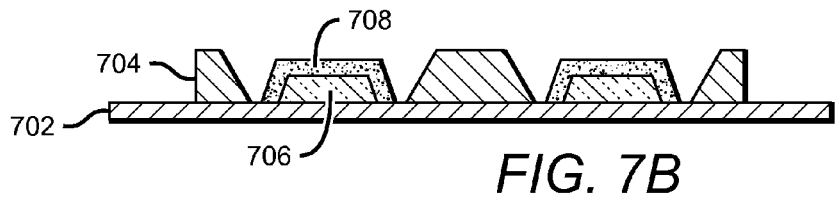
FIG. 7B
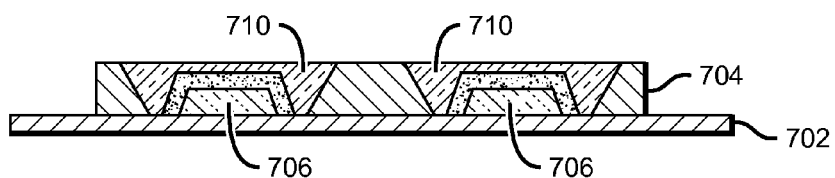
FIG. 7C
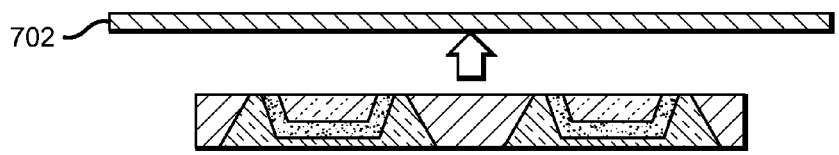
FIG. 7D
FIG. 7E
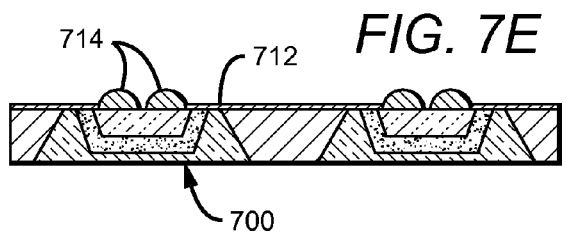
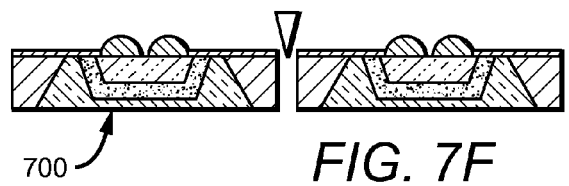
FIG. 7F
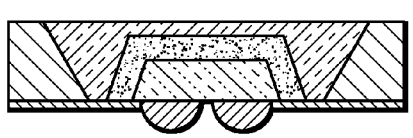
FIG. 7G
FIG. 7H
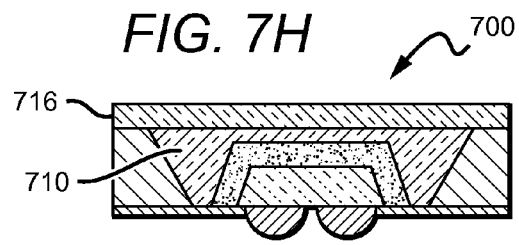

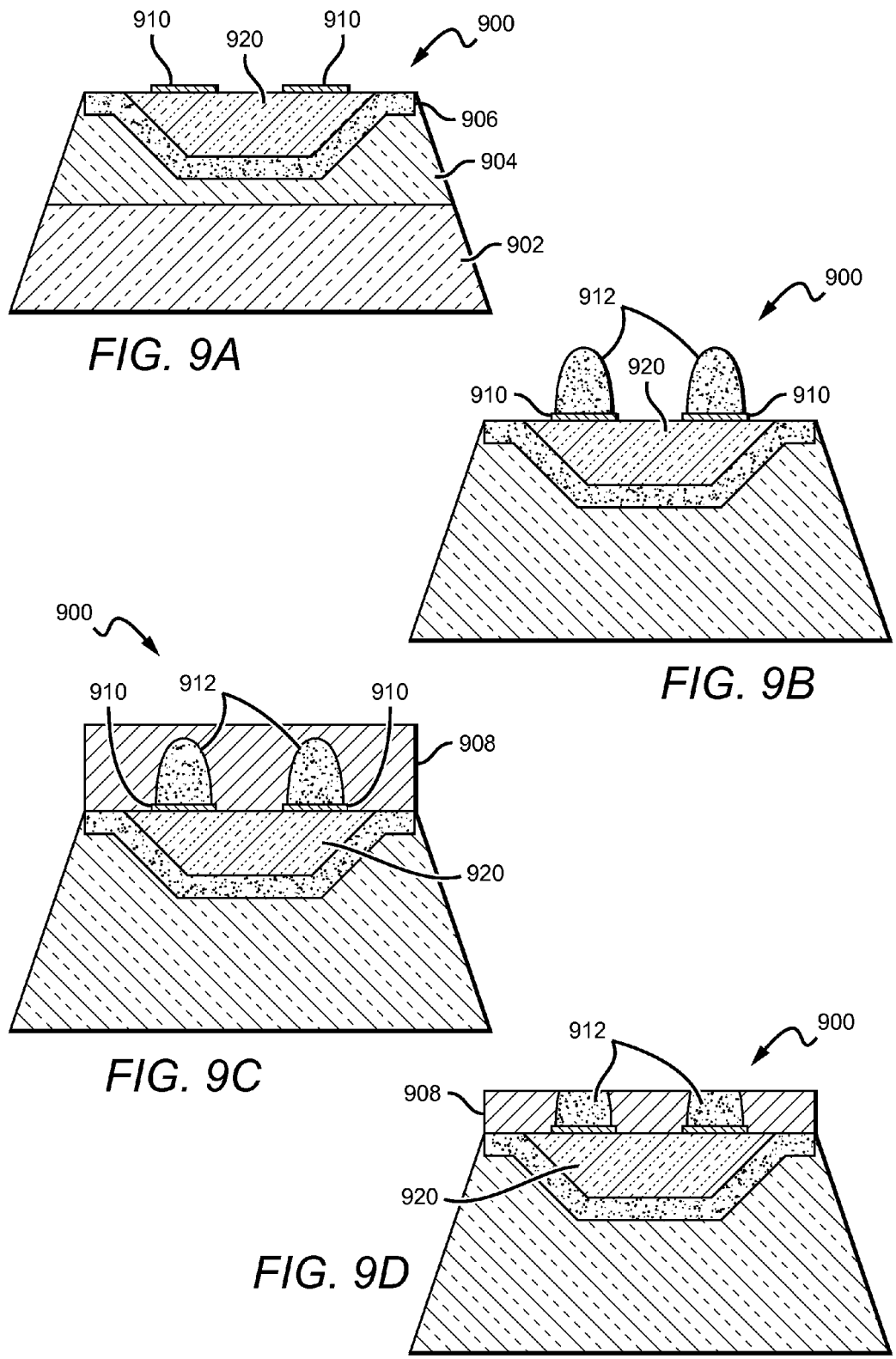

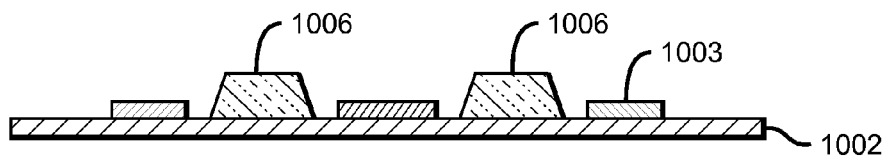
FIG. 10A
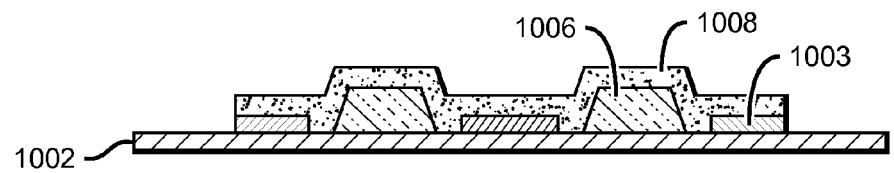
FIG. 10B
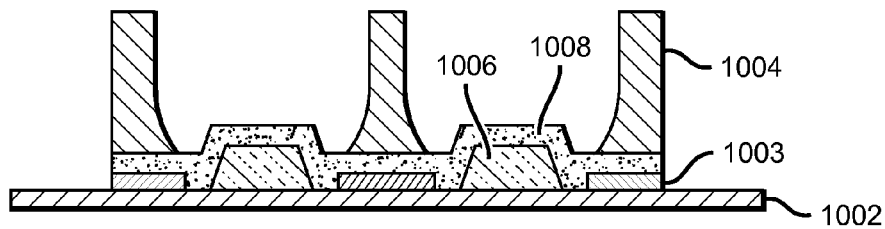
FIG. 10C
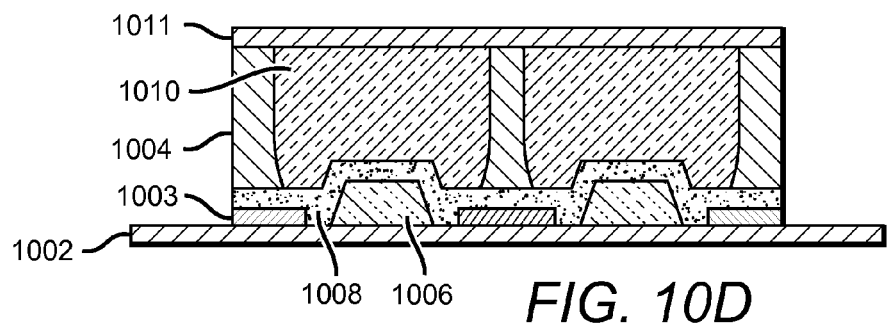
FIG. 10D
FIG. 10E
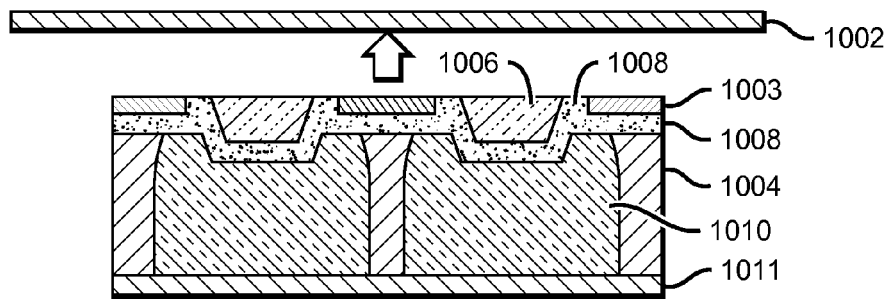

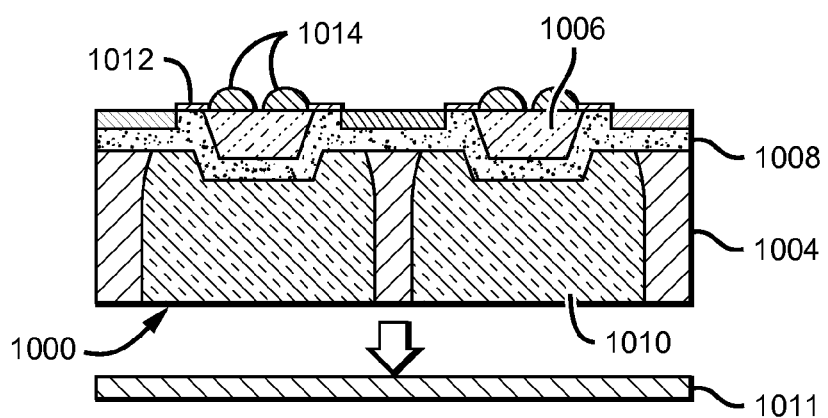
*FIG. 10F*
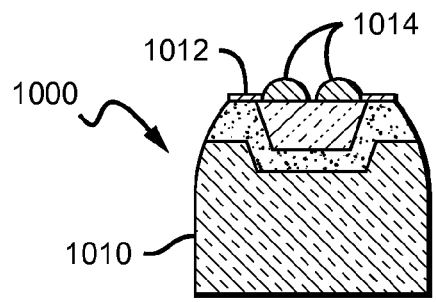
*FIG. 10G*
*FIG. 10H*
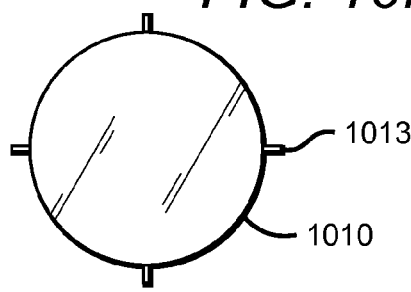
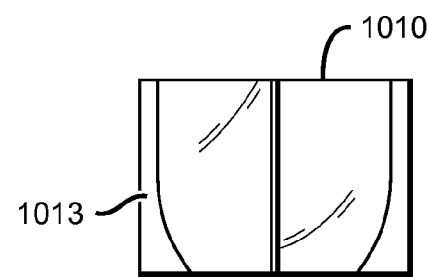
*FIG. 10I*

METHOD TO FORM PRIMARY OPTIC WITH VARIABLE SHAPES AND/OR GEOMETRIES WITHOUT A SUBSTRATE

BACKGROUND OF THE INVENTION

Field of the Invention

Described herein are devices and methods relating to optical elements of surface mount devices, such as light emitting diode (LED) chips and components and more specifically, to primary optics and packages for surface mount devices and methods of manufacturing such optics and packages.

Description of the Related Art

Surface mount devices, such as LED-based light emitting devices, are increasingly being used in lighting/illumination applications. Semiconductor LEDs are widely known solid-state lighting elements that are capable of generating light upon application of voltage thereto. LEDs generally include a diode region having first and second opposing surfaces, and including therein an n-type layer, a p-type layer and a p-n junction. An anode contact ohmically contacts the p-type layer and a cathode contact ohmically contacts the n-type layer. In some cases, the diode region may be epitaxially formed on a substrate, such as a sapphire, silicon, silicon carbide, gallium arsenide, gallium nitride, etc., or growth substrate, but the completed device may have the substrate removed. The diode region may be fabricated, for example, from silicon carbide, gallium nitride, gallium phosphide, aluminum nitride and/or gallium arsenide-based materials and/or from organic semiconductor-based materials. In other configurations, it may be possible for the device to never include a substrate, such as if grown or processed on a virtual wafer.

Submounts are generally used in LED devices to interpose an LED chip and a printed circuit board. The submount may change the contact configuration of the LED chip to be compatible with the pads of the printed circuit board. The submount may also be used to support a phosphor layer or an encapsulating dome that surrounds the LED chip. The submount may also provide other functionality. Thus, a submount may include a receiving element onto which an LED chip is mounted using conventional die-attach techniques, to interface the LED chip and a printed circuit board. A submount generally has a thickness of at least 100 µm, and in some embodiments at least 150 µm, and in other embodiments at least 200 µm, and generally includes traces (such as on ceramic panels) and/or leads (such as in a Plastic Leaded Chip Carrier (PLCC) package).

The color or wavelength emitted by an LED is largely dependent on the properties of the material from which it is generated, such as the bandgap of the active region. It is often desirable to incorporate phosphors into a LED to tailor the emission spectrum by converting all or a portion of the light from the LED before it is emitted as it passes through.

The application of a conversion layer to an LED chip is typically done at the package level after the LEDs have already been singulated and subsequently bonded to an electronic element, such as a PCB. However, applying a conversion material at the package level rather than the wafer level is a less efficient manufacturing process, as it is much easier and cost effective to coat multiple LED chips simultaneously at the wafer level. Therefore, it is desirable to process steps at the wafer level or using a virtual wafer. It is also desirable to create devices which can forgo the use of an additional substrate or submount.

LED packages typically have some type of encapsulant surrounding the LED chip to enhance light extraction or beam shaping from the chip and protect the chip and related contacts structure (e.g. wire bonds) from exposure to physical damage or environmental conditions which could lead to corrosion or degradation. The lens can have a hemispherical shape and can be mounted to the package by the encapsulant.

LEDs typically emit light primarily into a hemispherical lens or in a hemispherical emission pattern. This confined emission, typically in the form of a Lambertian profile, is not generally suitable for many applications such as those requiring beam shaping; for example, collimated beam profiles, dispersed beam profiles, or specialized beam profiles.

For current state-of-the-art LED packages intended for lighting applications, a common configuration is the 'surface mount' package which incorporates one or more LED chips onto a planar substrate. One or more primary optical elements are then applied to this substrate, typically by a molding process. Present surface-mount LED package technology typically utilizes either a separate glass lens or a molded silicone lens. For surface mount packages, which typically require high temperature (200-300° C.) solder reflow processing to attach the LED package to its final fixture, the possible lens materials typically include silicones and glasses. These lenses are piecepart molded using known processes, such as injection molding, and are then affixed to the LED package.

By nature, the primary optical elements typically surround or encapsulate one or more LED chips and any associated electrical contacts. The preferred geometry for the primary optical element 10 has been a predominantly hemispherical shape, the manufacturing of which as shown in FIGS. 1A-1C. This shape has two primary benefits: (1) if large enough relative to the LED source, most of the light emitted by the LED is incident on the optic surface with a path that is nearly parallel to the surface normal (since the optic is typically surrounded by air and has an index of refraction higher than air, this minimizes the possibility of total internal reflection and hence efficiency loss), and (2) hemispherical shapes are readily fabricated onto planar surfaces by conventional molding processes. Furthermore, these hemispherical optics may suffer from output losses caused by total internal reflection ("TIR") and the extraction efficiency of these domes remains low.

While the hemispherical optic 10 geometry is desirable with respect to efficiency and ease of fabrication, this geometry does little to modify the initial optical output beam profile from the LED source, outputting light in a Lambertian profile. In order to achieve light beam profile collimation, dispersion, or shaping, it is generally necessary to utilize a more complex optical geometry. However, many such geometries are not readily fabricated by molding processes. Specifically, since the mold cavity must be removed from the substrate surface following curing of the molded optic, it is not generally possible to mold parts which have 'overhangs', are tapered, or are narrower at the base, near the substrate, than at the top, as the substrate determines the orientation of the device within the mold.

As illustrated in FIGS. 1A-1C, in traditional molding, a mold 108 is applied to a planar substrate 100 with associated LED chips 102. The cavities in the mold are filled with a suitable encapsulating/optical material such as silicone or epoxy. The encapsulant is then at least partially cured, and the mold removed, leaving behind encapsulant on the surface in the form of a primary optical element. In order to remove the mold from the primary optic after at least partial curing, it is necessary that there are no regions of 'overhang' which would prohibit mold removal. This limitation in particular can inhibit the molding of many collimating-type optics. While there are molding techniques which can allow overhang geometries, they typically involve complex molds with moving parts which are not suitable for batch fabrication of many molded elements in an array on one surface. Additionally, the inclusion of a substrate interferes with these processes. Undercuts on optics require mold pieces to pull out sideways. These mold types are called side actions. Furthermore, traditional molds must be used; a more efficient dispensing process without a mold cannot be utilized to create complex primary optics for a plurality of LEDs on a surface because molds are currently required to provide complex shaping.

As a result of these limitations, beam shaping is typically achieved through the use of 'secondary' optics. Such secondary optics generally increase the overall cost and reduce efficiency. Further, the shape of the secondary optic can be limited by the size and geometry of the primary LED optic or lens—this can further reduce efficiency and limit the potential for beam shaping in some applications, particularly those involving collimation of the LED light, where it is helpful to bring the optical element as close to the light source (LED chip or chips) as possible. The use of secondary optics can result in lighting solutions which are bulky, require additional design work and alignment, optical loss, and additional costs. Therefore, it is desirable to be able to create primary optics with overhangs or undercuts in a more efficient manner.

SUMMARY OF THE INVENTION

The present invention provides various embodiments of optics over submount free devices and methods of fabricating the same, such that these devices are capable of beam shaping and can be manufactured in arrays. Furthermore, though the optics may include overhangs, undercuts or tapered shapes, these fabrication techniques do not require the use of complex molds with moving parts.

One embodiment according to the present disclosure describes a method for fabricating a submount-free light emitter package, comprising providing a surface with a light emitter and providing a structure at least partially surrounding the light emitter and creating a cavity. Additionally, the method also includes providing an encapsulant material over the light emitter in the cavity, such that this encapsulant covers at least part of the light emitter, such that the shape the encapsulant takes is at least partially defined by the structure.

Another embodiment according to the present disclosure describes a light emitter package, comprising a light emitter and a structure that surrounds the light emitter. The package also includes an encapsulant over the light emitter forming a primary optic, such that the structure at least partially defines the shape of the primary optic and the package is submount free.

Other embodiments according to the present invention also include arrays of packages and fabrication of arrays of these packages.

A better understanding of the features and advantages of the present embodiments will be obtained by reference to the following detailed description of the invention and accompanying drawings, which set forth illustrative embodiments in which the principles of the invention are utilized.

BRIEF DESCRIPTION OF THE DRAWINGS

FIGS. 7A-7F are side cross-sectional views of a method of creating optics according to an embodiment of the present disclosure.

FIG. 7G is a side cross-sectional view of another embodiment of an optic according to the present disclosure, as formed by a method such as that shown in FIGS. 7A-7F.

FIG. 7H is a side cross-sectional view of another embodiment of an optic according to the present disclosure, as formed by a method such as that shown in FIGS. 7A-7F.

FIG. 9A is a cross-sectional side view of a device before contact bump formation, according to another embodiment of the present disclosure;

FIG. 9B is a cross-sectional side view of a device after contact bump formation, according to another embodiment of the present disclosure;

FIG. 9C is a cross-sectional side view of a device after reflective layer placement, according to another embodiment of the present disclosure;

FIG. 9D is a cross-sectional side view of a device after mount surface grinding, according to another embodiment of the present disclosure;

FIGS. 10A-10F are side cross-sectional views of another method of creating optics according to an embodiment of the present disclosure.

FIG. 10G is a side cross-sectional view of another embodiment of an optic according to the present disclosure, as formed by a method such as that shown in FIGS. 10A-10F.

FIG. 10H is a top plan view of another embodiment of an optic according to the present disclosure, as formed by a method such as that shown in FIGS. 10A-10F.

FIG. 10I is a side elevation view of another embodiment of an optic according to the present disclosure, as formed by a method such as that shown in FIGS. 10A-10F.

DETAILED DESCRIPTION OF THE INVENTION

Figure 1A:
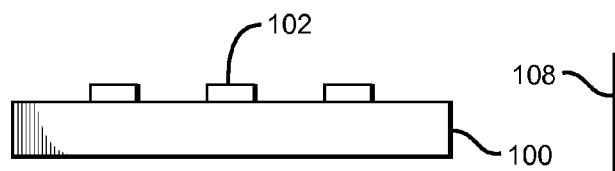
FIG. 1A is a side view of the first step in an embodiment of fabricating a traditional hemispherical LED.
Figure 1B:
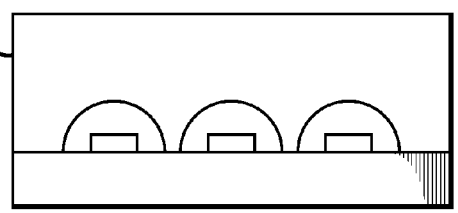
FIG. 1B is a side view of the second step in an embodiment of fabricating a traditional hemispherical LED.
Figure 1C:
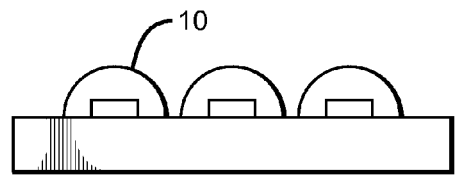
FIG. 1C is a side view of the third step in an embodiment of fabricating a traditional hemispherical LED.

Embodiments of the present invention provide improved light emitting device optics and packages and methods for fabricating the same, wherein the improvements are provided by fabricating primary optics, with overhands or tapered shapes, capable of shaping light beams over light emitters. The primary optics disclosed herein and methods of fabricating the same allow for controlled or shaped light outputs from light emitters without the use of secondary optics. However, secondary optics may still be used in conjunction with these primary optics. Furthermore, the methods disclosed herein allow for the fabrication of arrays of these optics, at the wafer level, in smaller areas because no moving parts or side action molds are required. Embodiments of the present invention may be more cost effective and efficient as complex moving molds are not necessary. The invention may be applied to other light sources such as lasers, optical fibers, etc. or even to non-light emitting applications (e.g., camera phone lenses, etc.) where it is desirable to fabricate a complex optical element onto a surface.

The present disclosure will now set forth detailed descriptions of various embodiments. These embodiments provide methods and devices pertaining to surface mount devices and solid state devices, such as light emitting devices, various light emitters, LED chips, LED wafers, LED components, and methods of manufacture thereof. Embodiments incorporating features of the present invention allow for the efficient addition of primary optics to substrate free devices. These embodiments may also incorporate the addition of contact bumps to devices with reflective coatings that would otherwise result in recessed contacts. Some embodiments of this disclosure may refer to contact pads with contact extensions, it should be understood that the contact extensions may be contact bumps or any other type of extension. For simplicity, the term contact bumps may refer to other types of extensions as well. Additionally, the term contact may refer to both the term contact pad and extension, or the combination of both.

In some embodiments incorporating features of the present invention, solid state devices, such as LED chips or packages, are provided with contact bumps arranged such that they protrude from or are exposed at the bottom or mounting surface of the device, enabling the contact bumps to make contact with mount surfaces without the need for an additional substrate or submount. The contact bumps are provided in contact with contact pads on the device. The mounting surface of the device is the surface, which will be adjacent to the mount surface that the device is being mounted to. After or before the contact bumps are provided, the mounting surface of the device is covered or flooded with a white or reflective material. The white or reflective material can at least partially cover the contact bumps and may be disposed on all sides, or some sides, of the contact bumps. Next, if needed, the bottom of the device is polished or ground to expose the contact bumps for mounting, or to provide a substantially uniform, planar, or even mounting surface.

In some embodiments, according to the present invention, the contact bumps are formed at the wafer level by a process which utilizes a stencil, the contact bump material, and a squeegee or blade for distributing the material in equal amounts to the device through the stencil. This equal distribution allows contact bumps of uniform size to be made at the wafer level for a plurality of devices. Embodiments according to the present disclosure can allow for devices to be efficiently provided with contact bumps at a wafer, "virtual wafer" or array level. The contact bumps may also be formed by other methods such as wave soldering, ink jetting, sputtering, provided via preforms, gold-wire-ball bumping, or by evaporation, such as CVD or PVD. In some embodiments, contact bumps may also be formed by electroplating a metal, such as Nickel, on the contact to a thickness, such as 50 um (−20 um +50 um). The thickness of this metal may range from 15 um to 150 um. Electroplating (or similar techniques) may be accomplished at the wafer level with very little cost and achieve a "wafer-fab-quality-bumped" contact effect. This metallization build up can then be further electroplated or electroless deposited for a termination, which is solderable and oxidation friendly. This technique can also be used to extend contact bumps past the reflective layer and in reverse to build up substrates so that a chip can be placed, such that a reflective ring can be wicked underneath for light extraction benefits.

Embodiments incorporating features of the present invention can also include various structures to improve stability of a light emitter array, such as an LED chip array, during the manufacturing process, such as additional adhesive and/or virtual wafers comprising a silicone support, a glass support and/or a frame structure.

Some embodiments of light emitter components according to the present disclosure utilize a reflective material, such as a white diffusive paint or coating, metal reflector, or other type of reflective surface, to further improve light extraction and emission uniformity. This reflective layer may be applied to, and form a portion of, the bottom or mounting surface of the device. The thickness of this layer may, at least in part, cover or surround contact bumps placed on the contact pads, such that the contact pads are recessed in relation to the highest portions of the mounting surface of the device including the reflective layer, as the addition of the reflective layer may increase the height of the surface. In other embodiments, the contact pads may be recessed due to other reasons.

In the description that follows, numerous details are set forth in order to provide a thorough understanding of the invention. It will be appreciated by those skilled in the art that variations of these specific details are possible while still achieving the results of the invention. Well-known elements and processing steps are generally not described in detail in order to avoid unnecessarily obscuring the description of the invention.

Embodiments of the invention are described herein with reference to illustrations that are schematic illustrations of embodiments of the invention. As such, the actual size, components and features can be different, and variations from the shapes of the illustrations as a result, for example, of technological capabilities, manufacturing techniques and/or tolerances are expected. Embodiments of the invention should not be construed as limited to the particular shapes or components of the regions illustrated herein but are to include deviations in shapes/components that result, for example, from manufacturing or technological availability. The regions illustrated in the figures are schematic in nature and their shapes are not intended to illustrate the precise shape or functionality of a feature of a device and are not intended to limit the scope of the invention. In addition, components may be shown as one unit but may instead be a collection of components or units, or a collection of components or units may exist as one unit.

Throughout this description, the preferred embodiment and examples illustrated should be considered as exemplars, rather than as limitations on the present invention. As used herein, the term "invention," "device," "method," "present invention," "present device" or "present method" refers to any one of the embodiments of the invention described herein, and any equivalents. Furthermore, reference to various feature(s) of the "invention," "device," "method," "present invention," "present device" or "present method" throughout this document does not mean that all claimed embodiments or methods must include the referenced feature(s).

It is understood that when an element such as a layer, region or substrate is referred to as being "on" another element, it can be directly on the other element Or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing techniques. Thus, the regions illustrated in the figures are schematic in nature; their shapes are not intended to illustrate the precise shape of a region or particle and are not intended to limit the scope of the invention.

The term "light" as used herein is not limited to electromagnetic radiation within the visible spectrum. For convenience, "light" may also include portions of the electromagnetic spectrum outside the visible spectrum, such as the infrared or ultraviolet spectra, for example.

In some embodiments, it can be desirable to shape optics such that reflection or total internal reflection ("TIR") causes light beams incident on the sidewalls to reflect towards the exit face and be incident on the exit face with an angle less than or equal to the critical angle. Consequently, light loss due to TIR at the exit face is reduced or eliminated. An exit face of an optic is a face or surface from which light beams are intended to exit. Also, it can be desirable to use an optic which is as small as possible and the use of only a primary optic is smaller than the use of a primary and secondary optic due to the Etendue equation, because the size of a single optic would not need to accommodate the added distance from the light emitter caused by the use of both a primary and secondary optic. While the Etendue equation shows that theoretically 100% of the light that passes from the LED into the primary optic of the LED can exit the optic through the exit face, various embodiments may cause lesser amounts of light to exit the exit face while still providing significant improvements over prior LED light emissions. For example, light emitted from the exit surface of the LED may be emitted from the exit surface with an efficiency loss due to Fresnel losses.

Fresnel losses (e.g. losses at the interface between two mediums such as at the exit face of an LED and air or other medium) occur when light traverses from a medium of higher index to a medium of lower index. Depending on the index of refraction difference, on index difference, losses of approximately 4% of light output due to reflection may occur. Fresnel losses may be reduced or overcome by the reduction of interfaces, such as by only using a primary optic rather than both a primary optic and a secondary optic.

Figure 4:
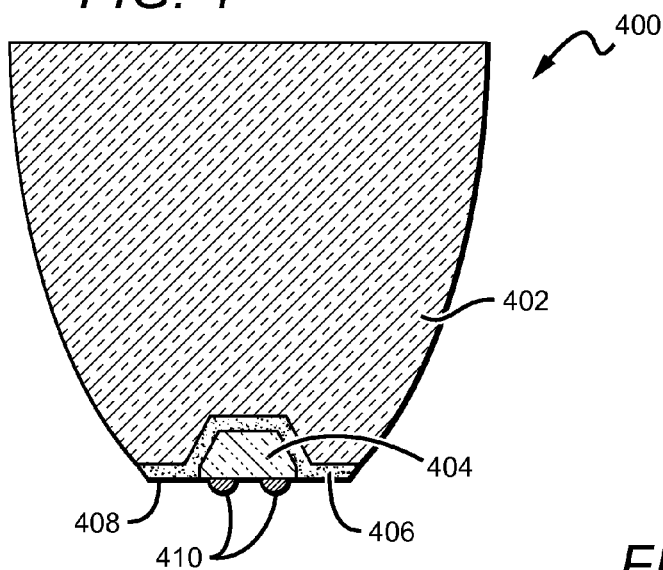
FIG. 4 is a side cross-sectional view of one embodiment of an optic according to the present disclosure.
Figure 5:
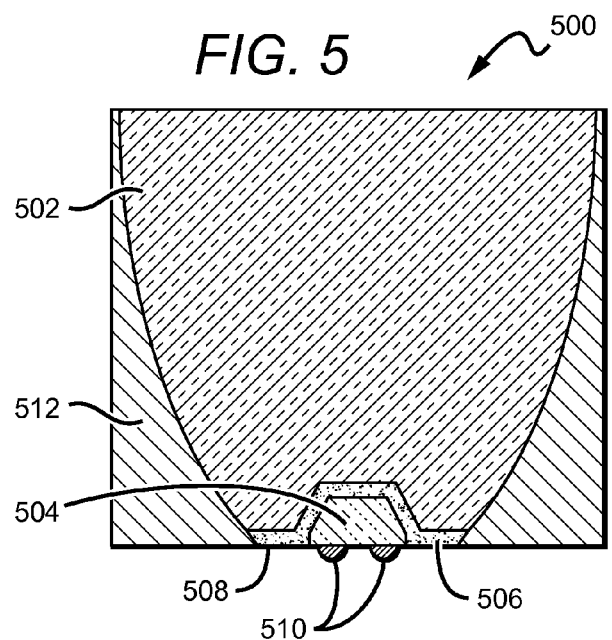
FIG. 5 is a side cross-sectional view of another embodiment of an optic according to the present disclosure.
Figure 6:
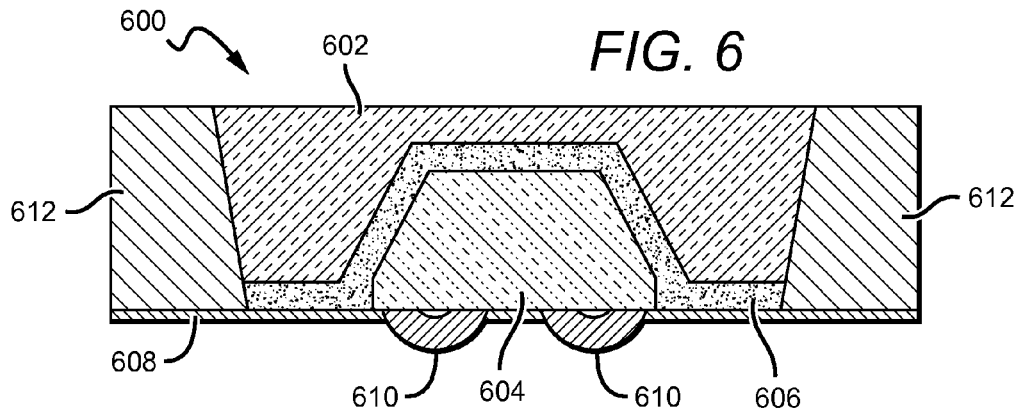
FIG. 6 is a side cross-sectional view of another embodiment of an optic according to the present disclosure.

The size of the exit face of a LED optic can be selected to conserve radiance. The passage of light along an optic path, either within a single medium or from one medium to another, is governed by the law of Conservation of Radiance, also referred to as the Brightness Theorem, which is expressed by the Etendue equation. The area of the exit face of an optic can be selected to conserve radiance of light entering the optic from the LED for a desired half angle. Consequently, light can be emitted in a desired half angle with high efficiency. This is unlike traditional hemispherical lens LED packages that both emit light with a half angle that is undesirable for many applications, therefore requiring additional optical devices to shape the light. These traditional packages also and, emit a significant percentage of light through the sidewalls because the exit face is not large enough to conserve radiance; while also suffering absorption losses due to the light never escaping the optic. The Etendue equation, or Conservation of Etendue, requires an exit face large enough to conserve radiance. Generally this exit face is larger than the base of the light emitter and therefore, to take advantage of an optic optimized according to the Etendue equation, a primary optic would have to have an exit face larger than the base of the optic as shown in FIGS. 4-6.

Figure 3:
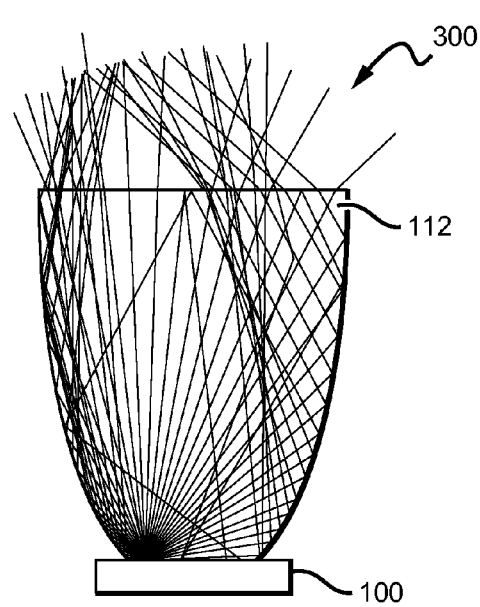
FIG. 3 is a side view of an embodiment of a light emitter package with primary optic with simulated light ray output according to the present invention.
Figure 2:
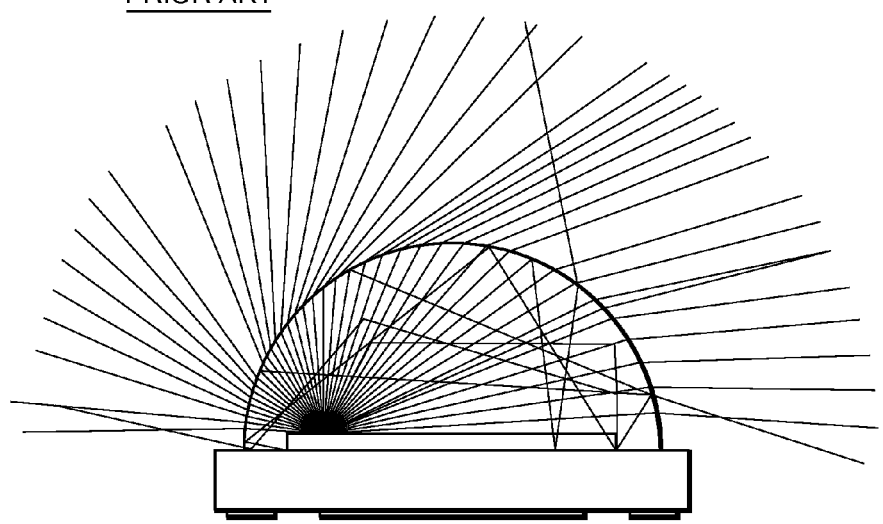
FIG. 2 is a side view of an embodiment of a traditional hemispherical LED with simulated light rays.

Conventional LED packages with hemispherical optics have a broad light output. One advantage of the optics produced by the embodiments disclosed herein can be illustrated using optical simulation of LED packages, as shown in FIGS. 2 and 3. FIG. 2 shows the simulated broad light beam intensity profile typically achieved using conventional hemispherical molded optical elements (lenses). With traditional optics shapes, in order to achieve a narrower or more focused light beam, reflectors or secondary optics must be used. These can result 1-15% optical efficiency losses from TIR, Fresnel losses, and other optical inefficiencies caused by this configuration. In contrast, as shown in FIG. 3, an optical element 112 with an overhang region, or narrower at the base 100, can be utilized to significantly reduce the width of the output optical beam, resulting in a more collimated emission more suited to applications, such as flood lamps. These can improve optical efficiency reducing the losses to only Fresnel losses. In alternate embodiments, beam shaping may be accomplished both by lens shape and by reflective coatings or sidewalls to achieve a similar outcome.

In order to create an LED package capable of shaping a beam, the primary optic may include features, which can be used to shape a beam. For example, to create a LED package with a primary optic capable of having a light output profile where the majority of the light emitted is within a specified critical angle, rather than a Lambertian output profile, such as a spot light or half max full width, the primary optic may require the incorporation of features described above, including tapering of the lens, undercuts, asymmetric features, beveling, bulges, reflective portions, hollow portions, or any other lens feature. Traditional fabrication of primary optics, on a substrate with the use of a mold, does not allow for the fabrication of optics which include a portion closer to the base that is narrower than the remainder of the optic, or an exit face larger than the base as required to conserve radiance. Such a configuration would create an overhang and prevent the removal of a mold without damaging the optics. Both the overhang of the lens and substrate the device is mounted to prevent the use of a conventional mold. Complex molds with moving parts may be used to create such an optic but they require additional space between light emitters for the moving parts to function and therefore are not nearly as efficient, since fewer optics could be produced at a time. In addition, produced emitters would require a larger area and be spaced further apart in packages and products.

Furthermore, the passage of light from a medium of one index of refraction ("RI") to a medium of a different RI is governed by Snell's Law. Snell's law defines the relationship between the angle of approach of a light ray as measured from the normal to the interface surface, and the angle of departure of that ray from the interface, as a function of the indices of refraction of both media. In the case of the passage of light from a medium of higher RI to a medium of lower RI, the maximum angle at which a light ray may strike the interface surface between the media and still pass through the interface is called the critical angle. Fundamentally, light originating from the medium of higher RI must approach the media interface at angles not exceeding the critical angle if the light is to pass through the interface and into the medium of lower RI. For example, in a LED package comprised of an optic over a LED, the optic and LED may form an interface that light generated by the quantum well regions traverses. Rays that approach at angles greater than the critical angle will be reflected back within the medium of higher RI at the interface between the media and will not pass into the medium of lower RI. This is referred to as total internal reflection ("TIR"). It is desirable to reduce the number of interfaces causing TIR in the directions in which light is intended to be emitted. Use of a single optic reduces the number of interfaces.

Using a primary optic to aid in beam shaping is advantageous to relying entirely on a secondary optic for this purpose. Secondary optics can be bulky, require the manufacturing, designing, and alignment of a second part, can cause optical loss, are costly to manufacture, and because silicone cannot easily be used, plastics or glass are used, which do not last as well as silicone. Furthermore, if a primary optic is used to beam shape, it allows for a reduction in LED package size because the primary optic may be smaller in size and height when providing the same functionality as a secondary optic due to the fact that it is placed much closer to the light source than a secondary optic. This would allow for mounting of more LEDs closer together on a board. In addition, though the primary optic would be capable of beam shaping, these primary optics can also be used in conjunction with secondary optics. The use of more complex primary optics may simplify the secondary optics being used. In addition, more complex primary optics may improve the efficiency of the emitter package itself or the efficiency of a package incorporating the use of a secondary optic.

FIGS. 4-6 show embodiments of exemplary packages formed by the methods of the present disclosure. FIGS. 7A-7H, 8A-8C, 9A-9D, and 10A-10I show embodiments of methods of fabricating an LED package, such as those shown in FIGS. 4-6, or, more specifically, forming lenses over a single or number of elements on a mount surface where an intermediate element or structure is utilized in forming the lenses. Forming of the lenses can be performed in cooperation with a mold or without. FIG. 7A-7F shows a method of forming optics over a number of elements using intermediate elements or structures. FIGS. 7G and 7H show examples of devices being fabricated by the method of FIGS. 7A-7H. FIGS. 7A-7H show methods that include intermediate elements or structures which may stay as a portion of the package, whereas FIGS. 10A-10G show methods that include intermediate elements or structures that may or may not form a portion of the final package.

Although the methods are described with reference to LEDs as the elements, it is understood that the method can be used to fabricate other devices. Elements may be other light sources such as lasers, optical fibers, etc. or the method may be used to fabricate non-light emitting devices where it is desirable to fabricate a complex optical element on a surface, such as camera phone lenses, etc. It is further understood that although the methods are shown as a series of steps, the steps can occur in different order and different steps can be employed. Furthermore, though a variety of optic shapes are shown, optics may be formed in any shape including conventional lens shapes, tapered lenses, asymmetrical lenses, side-emitting lenses, lenses with undercuts, convex lenses, concave lenses, or any other lens shapes which create any type of output profile. In addition, though the methods refer to a plurality of elements provided or a plurality of LEDS, it is understood that this method could also be used to form optics for a single element or LED.

The methods detailed in the disclosure relate to substrate or submount-free devices. A portion of the methods describe providing reflective layers and contact bumps on these devices. Though the reflective layer, contact pad and/or bump structures described herein may be used with any device, surface mount device, or solid state device, various embodiments described herein can relate to LED components. Some of these components may be arranged such that they eliminate the need for a submount or interposer between an LED chip and a printed circuit board on which an LED chip is mounted, thereby reducing the cost, size and/or complexity of these devices. Other embodiments may relate to LED packages, chips, or wafers.

Moreover, LED chips that do not include a submount may be placed on a tape, coated with a phosphor layer and, provided with a primary optic, as described in the methods. These devices may then be removed from the tape and then soldered to a printed circuit board without the need for an intervening submount. Other techniques may also be used to provide submount-free LED components and methods of manufacturing the same, according to various embodiments described herein. A wafer of the submount-free devices consists of a monolithic periodic array of chips. In some embodiments, these include an integrated wavelength converter and integrated encapsulant, but no substrate or submount on the bottom, such as a PCB or ceramic carrier.

In order for these devices to achieve the performance parity with traditional components, or to optimize or improve their performance, it may be desirable to at least partially coat the bottom of the device or wafer with a reflector or highly reflective material. In some embodiments, the thickness of this reflective material may be 5-200 microns. In other embodiments, this thickness may be 25-150 microns. In yet other embodiments, other thicknesses may be used to achieve the desired reflectivity. This reflective material coating encroaches inside the outer periphery of the chip, up to, and in some embodiments surrounding the contact pads. In some embodiments this material is applied after the contact bumps have been formed and the reflective material may at least partially surround and/or partially cover the contact bumps.

The following embodiments show one or more light emitters, optional scattering or converting layers and an optical element. Though conventional LED devices or components typically incorporate a substrate or package onto which the aforementioned elements are applied, the following embodiments omit such structures. This may allow for reduced component costs and also enables the fabrication of unique primary optic geometries—specifically, by eliminating the substrate or package carrier, it is possible to fabricate optical elements or lenses having an undercut region (e.g. parabolic or collimating lens shapes), or other shapes, using a conventional or simplified molding processes. This is possible since the molded "chip-in-lens" components may be removed from a mold through the wider cavity end, the end adjacent to the side of the lens furthest from the emitter, though this would be prohibited if a substrate having a larger dimension than the narrow end of the cavity were present. These finished devices may then be used individually or in conjunction with waveguides. Additionally, if multiple fabrication steps are used, the packages of these embodiments may be utilized to create light sources which are surrounded or completely enclosed within an optical element. For example, a chip at or near the center of a spherical or cylindrical optic.

FIGS. 4-6 show cross-sectional views of three exemplary embodiments of packages 400, 500, 600, or optics 402, 502, 602, which can be formed according to the present disclosure. FIGS. 4 and 5 depict parabolic lenses 402, 502, while FIG. 6 shows a cavity optic. Both packages 500, 600, of FIGS. 5 and 6 include a reflective coating or frame 512, 612. The package of FIG. 6 may also include an additional lens, such as a glass lens, over the optic 602. This is shown in FIG. 7H. Though these three embodiments are shown, it should be understood that optics of any shape may be formed and these are exemplary optic shapes. For example, the lenses or optics 402, 502, 602 may have any shape, including those which are not congruent, optics with any undercuts, optics which include concave, convex, domed, roughened or textured features, FIGS. 7A-H show a method of manufacturing the device shown in FIG. 6. FIGS. 10A-H show an exemplary method of manufacturing the devices shown in FIGS. 4 and 5.

The packages 400, 500, 600 include a light emitter 404, 504, 604. The light emitters are shown to have a trapezoidal shape; however, it should be known that any light emitter may be used. For example, Cree chips in the DA, EZ, GaN, MB, RT, TR, UT, and XT chip lines, or any other chips. Flip-chip emitters may be best suited for the packages due to contact placement. The packages also show a scattering or conversion layer 406, 506, 606 over the light emitters; however, this layer is optional. The devices of FIGS. 4-6 include a scattering or conversion layer, such as a phosphor layer, 406, 506, 606, provided on the light emitter 404, 504, 604. The phosphor or conversion material layer 406, 506, 606 of FIGS. 4-6 is shown to only extend over a portion of the light emitter, but it should be understood that this may be disposed in other areas as well. In some embodiments, the phosphor layer 406, 506, 606 is a conformal phosphor layer that may be less than about 150 μm thick in some embodiments, less than about 100 μm thick in other embodiments and less than about 50 μm thick in yet other embodiments. It will be understood that the term "phosphor" is used herein to denote any wavelength conversion material, and may be provided according to various configurations. Phosphor layer 406, 506, 606 may also be any type of functional layer or layers, such as any layer disposed to affect the properties of the emitted light, for example, color, intensity and/or direction.

Various techniques may be used to apply the phosphor layer 406, 506, 606, including dispensing, screen printing, film transfer, spraying, coating and/or other techniques. Phosphor preforms also may be applied. In some embodiments, the phosphor layer 406, 506, 606 may comprise silicone and/or other transparent material having phosphor particles therein. It will also be understood that the phosphor layer 406, 506, 606 is shown in FIG. 4-6 to be co-planar with the diode 404, 504, 604. However, the outer or edge portions of the phosphor layer 406, 506, 606 need not be co-planar with the emitter.

Moreover, FIGS. 4-6 illustrate the phosphor layer 406, 506, 606 as a thin conformal layer having uniform phosphor particle density. However, a phosphor layer may be provided that comprises phosphor particles that are non-uniformly dispersed therein, and that, in some embodiments, may include a phosphor-free region at the exterior surfaces of the phosphor layer. Moreover, the phosphor layer may also be configured as a conformal and/or non-conformal layer.

The phosphor layer 406, 506, 606, or any wavelength conversion layer, converts a portion of the light emitted from the diode 404, 504, 604 to a different wavelength, a process that is known in the art. One example of this process, is converting a portion of blue-emitted light from light emitter, such as an LED chip, to yellow light. Yttrium aluminum garnet (YAG) is an example of a common phosphor that may be used.

In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}RE_xO_{12}$:Ce (TAG);
RE=Y, Gd, La, Lu; and/or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and re-emit red light. First and second phosphors can also be combined for higher CRI white (i.e., warm white) with the yellow phosphors above combined with red phosphors. Various red phosphors can be used including:

$Sr_xCa_{1-x}S$:Eu,Y;
Y=halide;CaSiAlN$_3$:Eu; or
$Sr_{2-y}Ca_ySiO_4$:Eu.

Other phosphors can be used to create saturated color emission by converting substantially all light to a particular color. For example, the following phosphors can be used to generate green saturated light:

$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion:

Yellow/Green
$(Sr,Ca,Ba)(Al,Ga)_2S_4$:$Eu^{2+}$
$Ba_2(Mg,Zn)Si_2O_7Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu % $Ba_2SiO_4$=$Eu^{2+}$ Red
$Lu_2O_3$=$Eu^{3+}$
$(Sr_{2-x}La_x)(Cei_{1-x}Eu_x)O_4$
$Sr_2C_{1-x}Eu_xO_4$
$SrTiO_3$:$Pr^{3+}$,$Ga^{3+}$
$CaAlSiN_3IEu^{2+}$
$Sr_2Si_5N_8$=$Eu^{2+}$ In some embodiments, the layer 406, 506, 606 may be a functional layer which comprises a light scattering layer, which comprises a binder material as discussed above and light scattering particles, for example titanium oxide particles. In other embodiments, the layer comprises materials to alter the refractive index of the functional layer. In some embodiments, the functional layer comprises a combination of one or more of the types of functional layers described herein (e.g. a wavelength conversion layer and a scattering or refractive index altering layer).

In some embodiments, the diode region or light emitter 404, 504, 604 is configured to emit blue light, for example light having a dominant wavelength of about 450-460 nm, and the phosphor layer 406, 506, 606 comprises yellow phosphor, such as YAG:Ce phosphor, having a peak wavelength of about 550 nm. In other embodiments, the diode region 404, 504, 604 is configured to emit blue light upon energization thereof, and the phosphor layer 406, 506, 606 may comprise a mixture of yellow phosphor and red phosphor, such CASN-based phosphor. In still other embodiments, the diode region 404, 504, 604 is configured to emit blue light upon energization thereof, and the phosphor layer 406, 506, 606 may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. In still other embodiments, a phosphor layer is not used. For example, a blue, green, amber, red, etc., LED need not use phosphor. In embodiments which do use a phosphor, it may be beneficial to provide a uniform coating in order to provide more uniform emissions.

Referring now to FIG. 4, the light emitting device 400 includes a light emitter 404, in this embodiment a Light Emitting Diode (LED) chip 404. The LED chip 404 includes a diode region that includes therein an n-type layer and a p-type layer. Each of these n-type and p-type layers may include one or more of each layer. These layers may have different compositions and thicknesses as is known to those in the art. Any reference to the n-type layer or p-type layer may be referencing one or more of the respective layers. Other layers or regions may also be provided in the diode region, which may include quantum wells, buffer layers, etc., that are understood in the art and need not be described herein. Moreover, the n-type layer and the p-type layer may be adjacent to one another to form a p-n junction or may be spaced apart from one another. The diode region may also be referred to herein as an "LED epi region", because it is typically formed epitaxially on a substrate. For example, a Group III-nitride based LED epi may be formed on a silicon carbide growth substrate. In some embodiments, the growth substrate may be present in the finished product. In other embodiments, the growth substrate may be removed. In still other embodiments, another substrate may be provided that is different from the growth substrate, and the other substrate may be bonded to the LED epi region after removing the growth substrate.

Though not shown separately in the figures, a transparent substrate, such as a transparent silicon carbide growth substrate or a transparent sapphire growth substrate, may be provided on the diode region. As used herein, a layer or region of an LED is considered to be "transparent" when at least 50% of the radiation from the LED that impinges on the transparent layer or region emerges through the transparent region.

Still referring to FIG. 4, contact bumps 410 electrically contact the p-type or n-type layer. In some embodiments, the contact bumps may also be ohmic bumps. The anode and cathode contacts may directly ohmically contact the n-type layer and the p-type layer, respectively, or may ohmically contact these layers by way of one or more conductive vias and/or other intermediate layers.

FIG. 4 also show a portion 408 which extends below the light emitter 404. Portions 408 may be a reflective layer or other structural portion, which extends below the light emitter, extending on the bottom surface of the conversion material layer. The inclusion of portion 408 may increase output efficiency of the device as the light emitted from the area between the contact bumps 410 and the edge of the device is reflected by portion 408 rather than absorbed. In other embodiments, portion 408 may be a dielectric material, or a polymeric material. In yet other embodiments, portion 408 may include reflective particles in a polymeric matrix, such as a white reflective material. In other embodiments, portions 408 may include other optical elements, or other particles, such as diffusers, reflectors, and/or scattering particles. In one example, the matrix may include a conversion material, such as phosphor. In addition, portions 408 may be disposed to improve thermal conductivity.

FIGS. 5 and 6 may have similar portion to the reflective portion of FIG. 4. The portions 408, 508, 608 of FIGS. 4-6 are a reflective layer; examples of such reflective layers include a dielectric mirror, a white reflective layer, such as a titania-filled layer, and/or other white/reflective layer. Many different reflectors can be used including a mirror layer comprising silver, diffuse reflectors, materials comprising a reflective white color, and thin film reflectors, such as metal or dielectric layers. In some embodiments the reflective layer may include a binder material. In yet other embodiments, the reflective layer may include a binder and a conversion material. In still other embodiments, the reflective layer may be a silicone based epoxy. In other embodiments, this reflective layer may have other thicknesses, including some which do not exceed the thickness of the contacts 410, 510, 610. Furthermore, in other embodiments, the reflective layer shown by portions 408, 508, 608 may also extend between the contacts 410, 510, 610. In embodiments where the reflective layer 408 exceeds the height of the contact bumps 410, it is difficult to mount such devices as the contacts would be recessed in relation to the mount surface of the device. Therefore, it is desirable to include solder material or generate a higher contact bump with enough material to overcome or meet the height barrier of the reflective layer or to grind down the reflective layer to expose the contacts. In other embodiments it may also be desirable to have a balanced amount of material on both contact pads so that uniform attachment is achieved.

FIGS. 7A-7H are a cross-sectional view of an embodiment of a method or process of making a package similar to the package shown in FIG. 6. FIG. 7A shows a tape or virtual carrier 702 and a structure 704 over the tape 702. The tape or virtual carrier 702 is used to carry or hold the light emitters for use in the packages, as these emitters are substrate or submount free, they are placed on a tape 702 so that the process can be carried out on multiple devices at once. The tape 702 may be a thermal release tape. The structure 704 may be reflective ink, plastic, or a lead frame. In embodiments in which the structures 704 are reflective ink, a screen printing or other similar process may be used to dispose the structure 704 on the tape 702. These structures may be used for alignment with regard to placing light emitters. In some embodiments, these structures may be permanent, while in other they may be removed.

In the next step, shown in FIG. 7B, light emitters 706 are placed on the tape 702. Placement may be via a pick and place process. A conversion layer 708 is shown on the light emitters 706. The light emitters may include converter layers or a converter layer may be added after the light emitter has been placed on the tape, such as by dispensing, spraying or slot coating the emitters. The structures 704 form a cavity around the emitter 706.

Following the placement of the emitter 706, the cavity formed by the structures 704 is filled with an encapsulant material 710, as shown in FIG. 7C. This material may be a silicone or other suitable transparent material. The encapsulant 710 may be dispensed, molded, slot coated or applied by any other suitable method.

In the step shown in FIG. 7D, the carrier or carrier tape 702 is released, such as by a thermal or chemical process. In some embodiments, an additional carrier may be included during this step on the side of the packages opposite the side the original carrier was adhered to. Next, in the step depicted in FIG. 7E, a reflective layer 712 and contact bumps 714 can be added on the packages or devices 700. The methods and processes of adding these features are described in more detail in relation to FIGS. 8A-8C and 9A-9D.

Following the application of the reflective layer 712 and contacts 714, the packages or devices are singulated as shown in FIG. 7F. Singulation may be accomplished using any suitable method such as dicing, blade, score and breaking, or by a chemical process. Prior to singulation, the packages 700 may undergo a number of additional steps, if desired, which are not shown. For example, portions of the lens or encapsulant 710 may be textured or modified in other ways, such as to change the surface shape or features. Additionally, if desired a glass lens may be placed over the devices. FIGS. 7G and 7H show two exemplary finished products after completing the process shown in FIGS. 7A-7F. The device or package 700 of FIG. 7H includes an optional additional glass lens 716 over the silicone encapsulant 710, while the package of FIG. 7G does not. A glass layer or lens may be used to impact output profiles or to provide more device stability or rigidity.

Figure 8A:
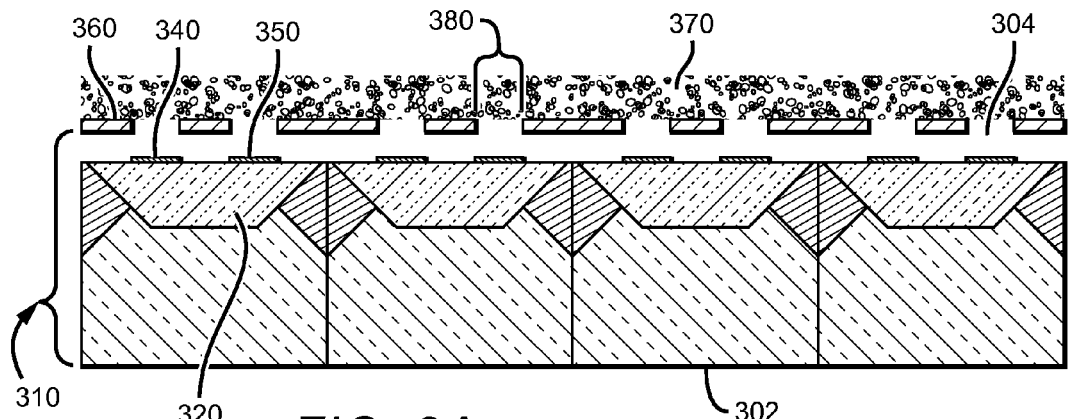
FIGS. 8A-8C are cross-sectional side views of a wafer or virtual wafer of devices, showing a method of forming contact bumps, according to an embodiment of the present disclosure.
Figure 8B:
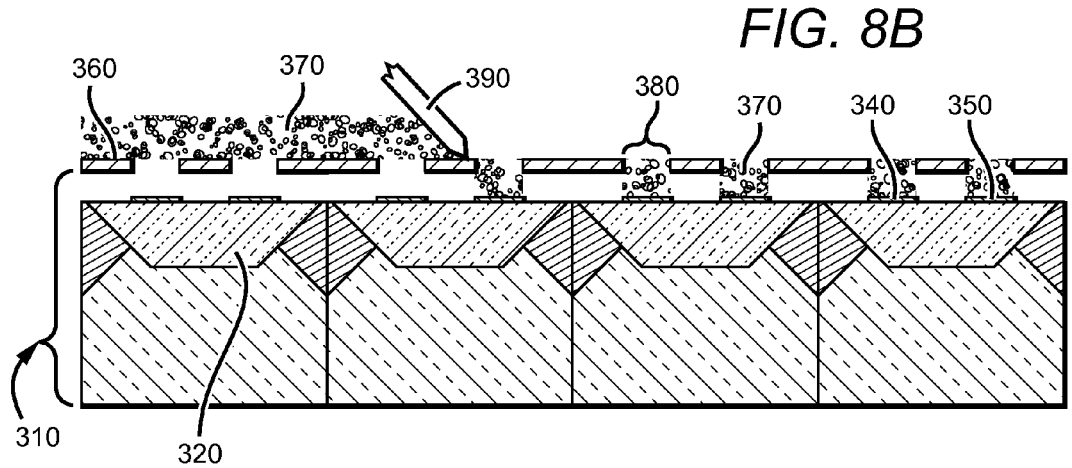
Figure 8C:
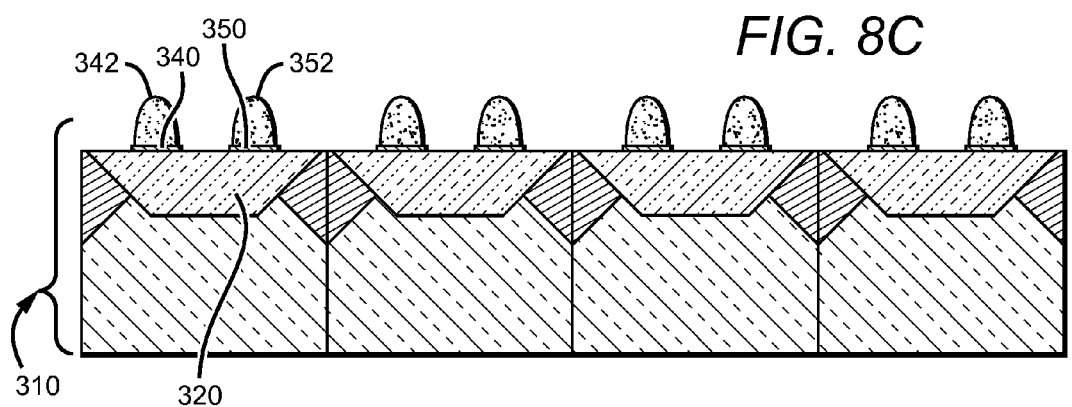

FIGS. 8A-8C show one embodiment of a method for providing contact bumps 342, 352 over the contact pads (or contact portions of the emitter) 340, 350, such that the contact bumps 342, 352 protrude beyond the lowest point of the mounting surface, the mounting surface being a surface of the emitter which will be mounted to another surface for use. Though the figures show four devices in the array, it is understood that a wafer or virtual wafer could include many more devices. The method shown in FIGS. 8A-8C is an exemplary method which may be utilized in the steps shown in FIG. 7E or 10F.

FIGS. 8A-8C are cross-sectional views of an array of devices arranged for wafer level processing. Wafer level processing may also refer to virtual wafers. In FIG. 8A, an adhesive, such as a tape based adhesive, is deposited and/or laminated on the top surface 302 of the array of devices. Optionally the adhesive may be placed on a carrier wafer, for example, a substrate commonly used in the art for mounting LED chips, such as a sapphire or silicon carbide substrate. This allows for the formation of a "virtual wafer" in which an array of LED dies can be deposited thereon. It is understood that the use of a carrier wafer is optional and provides the advantage of improving the structural integrity for the array; however, the virtual wafer may be created without the carrier wafer. Virtual wafers and integrated phosphors have been disclosed in a copending U.S. patent application Ser. No. 14/053,404, filed Oct. 14, 2013, by Heikman et al. entitled "CHIP WITH INTEGRATED PHOSPHOR," assigned to CREE, INC. The disclosures of this application are hereby incorporated by reference. Furthermore, the devices may be attached as shown in FIGS. 8A-8C or may be spaced apart as shown in FIGS. 7E and 10F.

FIG. 8A shows an array of devices 310, each device includes a diode or active region 320 and contact pads 340. The lowest point of the mounting surface 304 may be a reflective layer which is disposed on the bottom or mounting surface, therefore, the contact pads 340, 350 are recessed in relation to the plane of the mounting surface 304 of the device 310 after the reflective layer is applied (not shown in FIGS. 8A-8C), as this reflective layer may exceed in thickness compared to the contact pads. In order to form the contact bumps 342, 352, (FIG. 8C) a stencil 360, shown in FIGS. 8A and 8B, is provided over the mounting surface 304 over the array of devices 310, such that the stencil has openings aligned with and over the contact pads 340, 350. The stencil is shown spaced away from the surface 304; however, it is understood that a space is not necessarily required. This stencil may be made of any material which can withstand the material deposition process, such as metal. The process of providing the contact bumps only requires one alignment step which is the alignment of the stencil 360 over the contact pads 340, 350. An electrically conductive or solder material 370 is provided over the stencil.

FIG. 8B shows the array of devices 310 of FIG. 8A while the material 370 is being distributed through the openings 380 into the areas over the contact pads 340, 350. The desired material for the contact bumps, any electrically conductive material 370, is provided over the stencil 360 and devices 310. In some embodiments this electrically conductive material 370 may be a solder material, such as a lead free alloy. In other embodiments, this material may be provided as a paste. In yet other embodiments, this material is one which, when melted, only wets to the contact pads 340, 350. This electrically conductive material 370, is then provided in the openings 380 in the stencil over the contact pads 340, 350.

As shown, a blade or squeegee 390 may be used to evenly distribute the material 370. The blade 390 is passed over the surface of the stencil 360 forcing an equal amount of material 370 through the openings 380 and into the cavities below over the contact pads 340, 350. This material may also fall around the contact pads 340, 350; however, the material will gather over the contact pads 340, 350 during the reflow process. The amount of material 370 which enters the cavity through openings 380 can be adjusted by varying the thickness of the stencil, size of the openings 380, amount of material provided over the stencil, and by changing the speed and pressure with which the blade distributes the material.

After the material 370 is distributed in the cavities 380 over the contact pads 340, 350, the stencil 360 may be removed and the devices 310 undergo a reflow process. The bumping or solder material does not need to be placed neatly over only the contacts, as the material will move together and only bond with the contact pads during reflow. However, if the amount of material is in great excess or not adjusted correctly, some contact bumps may bridge and form a singular short circuited contact. In order to prevent such bridging, the amount of material disposed must be reduced, disposed at the accurate amount, and/or a solder dam may be placed between the contacts. Though the solder dam is not necessary, as the amount of material may be adjusted instead, a dam may be used. For example, barriers or solder dams of any type may be used.

During the reflow process, the material 370, or solder, gathers on the contact pads 340, 350 and attaches to the contact pads 340, 350 bonding together. The surface tension of the solder bump forms the contact bumps 342, 352 over and in contact with the contact pads 340, 350. These contact bumps 342, 352 may protrude beyond the height of a later applied reflective layer or may only protrude partially through the thickness of a reflective layer. These contact bumps 342, 352 can now be used to mount to any mount surface or device and create an electrical connection to the device 310. Therefore, the devices 310 may now be mounted to any surface or device and an electrical connection can be reliably made. The contact bumps 342, 352 can be attached to bare wires, printed circuit boards, or any type of submount, such as ceramic, metal core, etc. Thereby, the devices themselves are bumped and ready to be attached to a larger variety of systems, rather than bumping the surface that the devices will attach to. Additionally, the devices are bumped at the wafer, not package level, providing increased efficiency and requiring only a single alignment step. However, if desired, the devices may be bumped similarly at the package level as well.

Embodiments of the method described in relation to FIGS. 8A-8C can also allow for the placement of equal amounts of material on each contact pad. This allows for balanced devices, which are more reliable when mounted. In other embodiments, with other configurations, such as contacts which are not co-planar, it may be desirable to provide different amounts of material. This may be accomplished by providing a stencil with different sized openings. The process shown in FIGS. 8A-8C may be a low cost process, as it can use existing tools and material systems. Bumping by this process may also reduce solder bridging on the order of 100-300 microns. In other embodiments, rather than using a stencil and squeegee, the contact bump material may be distributed as preforms or through solder ink jetting techniques. After bumping, a reflective layer may be added. In other embodiments, the reflective layer may be provided before bumping.

The addition of the reflective layer before the formation of the contact bumps is possible and may be used, but this method may require additional steps of alignment, especially at the edges of devices and near contact pads. Alternately, the reflective layer may be added to the devices after the contact bumps are formed, as shown in FIG. 8C. FIGS. 9A-9D demonstrate the steps of providing contact bumps and a reflective layer for such devices, according to an embodiment of the present disclosure. FIG. 9A is a side view of a device 900 with recessed contact pads 910. The device includes a glass lens 902 and silicon encapsulant 904; however, these may not be required in all embodiments. The lens or encapsulant may be shaped using roughening, dicing, etching elements, molding or may be preshaped, a partial hemisphere, or may include concentric rings. Though the current shape is square or rectangular, any shape is appropriate, and any light extraction features may be used. The device 900 includes a wavelength conversion material 906, diode or light output region 920. In some embodiments, the light output region 920 may be inclusive of a substrate (not shown).

FIG. 9B shows a similar device 900 with contact bumps 912 formed over the contact pads 910 such that the device may be mounted to a mounting surface and electrical contact can be made with the contact pads and the mounting surface, through the contact bumps 912.

FIG. 9C shows another embodiment of a device 900 according to the present disclosure. The device also includes a reflective layer 908 over the original mounting surface and surrounding the contact bumps, which raises the height of the surface adjacent to the mounting area, thereby recessing the contact pads 910. The reflective layer now forms a portion of the mounting surface and covers at least the perimeter of the surface. In some embodiments layer 908 may cover the entire original mount surface, while in others it may not cover the contact pads or the area between the contact pads. The reflective layer 908 may be provided by flooding, screen stenciling, screen printing, spraying, doctor blade, pressing the device or wafer into the paint, spinning and/or squeegeeing. In some embodiments a solvent may be added to provide a shrinkage effect so the reflective layer will recess below contact bumps after curing. The reflective layer fill process can be accomplished by using a basic coating tool without the need for high accuracy alignment, translating to lower equipment costs, higher yields and increased throughput.

This device 900 includes the reflective layer 908 over and surrounding all areas around and between the contact pads 910 and bumps 912. Next, as shown in FIG. 9D, the device may be polished or ground to create an even surface and expose the contact bumps 912. Grinding may be completed by sand paper for localized grinding. Alternately, micromachining or a grinder may be used, such as by employing a fine grind with a controlling grit. Additionally, chemical processes may be used to expose the contact bumps 912, such as a chemical mechanical process (CMP) or polishing using a solvent. It should be noted that in other embodiments, the device may be at the chip, die, or wafer level and not yet include a phosphor layer, encapsulants or lenses. In such cases, the reflective layer may be added before these components, at the wafer level. The device could then subsequently be placed on a substrate, if desired, and undergo additional steps.

In some embodiments, the process shown in FIGS. 8A-8C may be repeated after the product or device shown in FIG. 8 is completed. For example, a second solder bumping process may be executed, which applies an amount of material, sometimes small, so the bump will protrude slightly past the reflective or white paint material. In some embodiments, the use of the term white paint material is in reference to a white reflective material, which provides a desired light extraction, such as reflectivity of greater than 80% or in some cases in the range of 90-94%. White reflective materials such as these, in some embodiments, may be a material having a high refractive index material loaded in a silicone. This material does not act as a surface reflector, instead allowing light to enter the material and interact with the particles therein, such that these interactions bend the light to reflect away. One advantage of using such a material is that this type of light interaction, because it bends light rather than reflects light directly back, allows for light to be fanned or bent away, such that less light may be absorbed when directly reflected. One example of such a white material, is a material which provides a balance, such that the loading/spatial-density of the high refractive index material in an index-matched silicone, results in the desired light extraction to be an effective reflective layer. Thicknesses of such materials may vary based on the amount of material loaded in the silicone. In some embodiments, these white reflective materials may have thicknesses higher than those of traditional reflectors, such as thicknesses greater than 20 µm or between 25-200 µm. This may result in improved attach yields. It should also be noted that in some embodiments, the processes shown in FIGS. 9A-9D may be carried out on a separate substrate or submount, which can then be attached to or coupled with a chip or device, such that the contact pads of the device are electrically connected to the contacts on the submount.

Using the methods disclosed herein, the contacts and reflective layer can be placed in a repeatable mass process. Performing the bumping process first ensures the highest yield compared to adding the reflective layer first as misalignments or bleed-in can impact the ability to bump the device. Additionally, the process allows for equal amounts of metal to be placed, which also improves reliability and the device will not be unbalanced. Also, taller solder joints, due to bumping, offer higher solder joint reliability by better absorbing strains generated during thermal expansion mismatch, due to temperature excursions, during operational life. Higher optical efficiency is achieved as all optically relevant areas are covered by the reflective material or ink leading to minimized light leakage from the contact side, resulting in higher efficiency. Also, the grind process leads to a planar surface which would ease wafer/device handling, assessment and pick-up off of tape, as the device will be more reliably flat on the tape, not tilted which causes inaccuracies in assessment of the device and pick-up. A more reliably flat device will allow for more accurate determination of the device's center, allowing the placement system to operate more accurately and reducing the need for extra calculations after the fact to compensate for inaccuracies caused by tilted devices.

As stated previously, the amount of material disposed over the contact pads may be adjusted by changing the stencil thickness, aperture size, and speed or force with which the blade is moved over the stencil. Therefore, a variety of different combinations of these measurements may be able to provide the desired result. Additionally, the desired result may vary on device size and application of the device. In an exemplary embodiment, a device with the size of 500 microns is in use. This device may have a reflective layer of 25-50 microns, though other devices may have layers which are less than 25 microns, or greater, such as up to 125 microns. For such a device, a stencil thickness in the range of 25-50 microns may be used. A stencil of 25 microns in thickness may be preferred. The force of the blade for this configuration may range from 50 gms force to 5000 gms force. However, it is understood that these are exemplary ranges and that any set of numbers may be used to achieve the desired result.

After the device is polished or ground such that the contact bumps are exposed for connection, as shown in FIG. 9D, the device or wafer is ready for subsequent processing, such as backend steps, including testing. If the devices are in a wafer, they may now be singulated and sorted. Singulation may be accomplished by blade, bevel cut, bevel cut blade, laser, scoring and breaking, or any other appropriate singulation process. In some embodiments, it may be advantageous to perform the break operation at an elevated temperature so that silicone will tear easily during the break. It may also be helpful to use a knife blade on the backside of the device prior to break to pre-scribe the reflective layer. A thin blade may then be used to cut the remaining portion of the device. After singulation the device may be mounted to any mount surface or substrate. If desired a solder paste may be placed between the exposed contact bumps and the mount surface connections.

FIGS. 10A-10G show cross-sectional views of a process, according to one embodiment of the present disclosure, of making parabolic optics or packages with parabolic optics, such as those in FIGS. 4 and 5. FIG. 10A shows a carrier 1002. Similar to the carrier shown in FIGS. 7A-7D, the carrier 1002 may be a tape carrier, such as a thermal release tape, or a virtual carrier. On the carrier 1002 are a number of light emitters 1006. Though the emitters 1006 shown have a trapezoidal shape, it should be understood that any type of light emitter, such as a flip-chip light emitter, may be used. Surrounding the light emitters are a mask or metal frame 1003, which is primarily used for alignment of the structure and may be released from the packages at a later time, if desired. The metal frame 1003 may be up to 100 microns thick, or in other embodiments up to 20 or 25 microns thick.

In the next step shown in FIG. 10B, a conversion material 1008 is dispensed or placed over the light emitters. The conversion material is shown to be conformal and over the emitters 1006 and the metal frame 1003; however, the conversion material can be disposed in any way, such as a blanket layer which is not conformal and in other embodiments, over only the light emitter 1006 and not the metal frame 1003.

FIG. 10C shows the following step in the method or process, wherein an intermediate structure 1004, which may be a lead frame, reflective ink frame, or other structure, is provided over the metal frame creating a cavity over and around the light emitters 1006. The structure 1004 may include or be created from reflective ink, to create reflective sidewalls if desired. In embodiments which use reflective sidewalls, the optic may be made to be shorter than a parabolic optic which does not have reflective sidewalls. This is possible as the output of the optic is not entirely dependent on TIR, but rather the reflectivity, which should be 97% or higher. Reflective ink sidewalls may also provide more stability to the device, both due to the reduced height and additional stabilization width.

Next, as shown in FIG. 10D, the cavity created by the structure 1004 is filled with an encapsulant, such as silicone, to create the optic. Additionally, a top plate assembly 1011 is placed over the optic 1010 and structure 1004, to provide additional structural stability during the process. Some embodiments may not include a top plate assembly. Additionally, though the top of the optic 1010 is shown to be flat, it may be concave, convex, or have any other extraction feature on the surface, such as texturing, roughening or surface features. The sidewalls of the optic may also include such features.

Following the release of the carrier 1002, as shown in FIG. 10E, the reflective portions 1012 and contact bumps 1014 are formed, as shown in FIG. 10F. These features may be formed as discussed above in relation to FIGS. 7E and 8A-8C. The top plate 1011 is also removed at this time.

Next the packages 1000 are singulated or removed by dicing or being pushed out, such as by pins, in the direction of the top plate. FIG. 10G shows an example of a device or package 1000 which is pushed out from the structure 1004 and is ready for mounting and use. In one embodiment, the package of FIG. 10G would have a height of 4-5 mm, which is greater than the width of the package. Such a height may make the device delicate and require support on mounting to a final PCB. In such cases, a ring or support material may be provided surrounding the device. This material may be disposed before or after mounting the device. In some embodiments, support for these packages may be provided by creating an optic which has fin like stability extensions as shown in FIGS. 10H and 10I. FIG. 10H shows a top plan view of such a package. As can be seen, the parabolic optic 1010 includes fin like extensions 1013. As these extensions are very narrow, they may not negative impact the optical efficiency of the optic 1010. FIG. 10I is a side elevation view of the device of FIG. 10H, showing the fins extending downward towards the mounting surface. In other embodiments the fins may have other shapes, such as widening at the bottom, or there may be other numbers (fewer or additional) of fins.

If fins or other stability features are not used, it may be desirable to provide a shorter more stable device. In order to provide a shorter, less delicate, device it is possible to manufacture an optic with reflective sidewalls such that a shorter optic would provide the same output profile. Therefore, device of FIG. 5 may also be made using this process, except unlike the device of FIG. 10G, the device of FIG. 5 would maintain at least a portion of the structure 1004 around the optic 1010 and this structure would likely be reflective.

It is important to note that the optic shape created by the methods described above may be shaped for mechanical reasons, optical reasons, aesthetic reasons, or a combination of any of these. Embodiments described herein can be applied to wafer (or virtual wafer) level processes.

In the drawings and specification, there have been disclosed embodiments of the invention and, although specific terms are employed, they are used in a generic and descriptive sense only and not for purposes of limitation, the scope of the invention being set forth in the following claims.

We claim:

1. A light emitter package, comprising:
a light emitter;
at least a package contact on said light emitter with no intervening submount between said at least a package contact and said light emitter; and
an encapsulant over said light emitter forming a shaped primary optic, wherein said at least a package contact is on said light emitter without directly contacting said encapsulant.

2. The light emitter package of claim 1, wherein said primary optic is capable of beam shaping.

3. The light emitter package of claim 2, further comprising a reflective material on the same side of the package as said at least a package contact.

4. The light emitter package of claim 2, wherein said at least a package contact directly connects to a circuit board.

5. The light emitter package of claim 1, further comprising a structure at least partially surrounding said light emitter, said structure at least partially defining the shape of said primary optic.

6. The light emitter package of claim 5, wherein at least a portion of said structure is capable of being removed.

7. The light emitter package of claim 5, wherein said structure cooperates with a dispense process.

8. The light emitter package of claim 5, wherein said structure is a permanent portion of said package.

9. The light emitter package of claim 5, wherein at least a portion of said structure is reflective.

10. The light emitter package of claim 1, wherein said primary optic is shaped to have an overhang portion.

11. The light emitter package of claim 1, wherein said primary optic includes wavelength conversion material.

12. The light emitter package of claim 1, further comprising a wavelength conversion material over said primary optic.

13. The light emitter package of claim 1, wherein said encapsulant is dispensed over said light emitter.

14. The light emitter package of claim 1, wherein said encapsulant is comprised of silicone.

15. The light emitter package of claim 1 further comprising a secondary optic over said primary optic.

16. The light emitter package of claim 1, wherein said primary optic has a tapered shape such that at least a portion closer to a base of said primary optic is narrower than at least a portion closer to an exit face.

17. The light emitter package of claim 1, wherein said primary optic has a parabolic shape.

18. The light emitter package of claim 1, wherein said package is a cavity optic with a tapered primary optic and reflective cavity walls.

19. The light emitter package of claim 18, further comprising a glass lens over said encapsulant.

20. The light emitter package of claim 1, further comprising a conversion material over said light emitter.

21. The light emitter package of claim 1, wherein said light emitter is on a removable carrier surface.

22. The light emitter package of claim 21, wherein said removable carrier surface is a thermal release tape.

23. The light emitter package of claim 21, wherein said removable carrier surface further comprises a metal frame.

24. A light emitter package, comprising:
a light emitter;
at least one structure at least partially surrounding said light emitter;
an encapsulant over said light emitter forming a primary optic, said at least one structure at least partially defining the shape of said primary optic, wherein said primary optic is shaped such that at least a portion closer to a base of said primary optic is narrower than at least a portion closer to an exit face; and
at least one package contact, said at least one package contact on said light emitter without directly contacting said encapsulant;
wherein said package is submount free.

25. The light emitter package of claim 24, wherein said primary optic is capable of beam shaping.

26. The light emitter package of claim 24, wherein at least a portion of said at least one structure is capable of being removed.

27. The light emitter package of claim 24, wherein said primary optic is shaped to have an overhang portion.

28. The light emitter package of claim 24, wherein said at least one structure is a permanent portion of said package.

29. The light emitter package of claim 24, wherein at least a portion of said at least one structure is reflective.

30. The light emitter package of claim 24, wherein said primary optic has a parabolic shape.

31. The light emitter package of claim 24, wherein said package is a cavity optic with a tapered primary optic and reflective cavity walls.

32. The light emitter package of claim 24, further comprising a glass lens over said encapsulant.

33. The light emitter package of claim 24, wherein said at least one package contact is completely underneath said light emitter.

34. The light emitter package of claim 24, further comprising a reflective material on the same side of the package as said at least one package contact.

* * * * *